US011194432B2

(12) United States Patent
Kim et al.

(10) Patent No.: US 11,194,432 B2
(45) Date of Patent: Dec. 7, 2021

(54) DISPLAY DEVICE

(71) Applicant: Samsung Display Co., Ltd., Yongin-Si (KR)

(72) Inventors: Keonwoo Kim, Cheonan-si (KR); Deukjong Kim, Cheonan-si (KR); Hyunwoo Kim, Cheonan-si (KR); Dong-Hyun Lee, Suwon-si (KR); Sangmi Jeon, Incheon (KR); Joohye Jung, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/850,074

(22) Filed: Apr. 16, 2020

(65) Prior Publication Data

US 2020/0356214 A1 Nov. 12, 2020

(30) Foreign Application Priority Data

May 7, 2019 (KR) .................. 10-2019-0052827

(51) Int. Cl.
*G06F 3/044* (2006.01)
*H01L 27/32* (2006.01)
(52) U.S. Cl.
CPC .......... *G06F 3/0445* (2019.05); *G06F 3/0446* (2019.05); *H01L 27/323* (2013.01)
(58) Field of Classification Search
CPC .... G06F 3/0412; G06F 3/0445; G06F 3/0443; G06F 3/0446; G06F 3/04164; H01L 27/323
See application file for complete search history.

(56) References Cited

U.S. PATENT DOCUMENTS

| 7,936,432 B2 | 5/2011 | Kim et al. |
| 7,973,474 B2 | 7/2011 | Kim et al. |
| 2009/0219227 A1 | 9/2009 | Takayama |
| 2010/0149159 A1 | 6/2010 | Kim |
| 2018/0308902 A1* | 10/2018 | Lee .................... G06F 3/04164 |

(Continued)

FOREIGN PATENT DOCUMENTS

| KR | 10-0700003 | 3/2007 |
| KR | 10-0700819 | 3/2007 |
| KR | 10-0839750 | 6/2008 |

(Continued)

*Primary Examiner* — Deeprose Subedi
(74) *Attorney, Agent, or Firm* — F. Chau & Associates, LLC

(57) ABSTRACT

A display device includes: a base layer including a display area and a non-display area; a circuit element layer disposed on the base layer; a display element layer disposed on the circuit element layer; a plurality of signal pads disposed on the base layer, wherein the plurality of signal pads are spaced a predetermined interval from each other, and are electrically connected to the circuit element layer; and an input sensing layer including a conductive layer and an input insulation layer, wherein the conductive layer is disposed on the display element layer, and the input insulation layer covers the conductive layer and a portion of each of the signal pads. Each of the signal pads includes a first pad portion and a second pad portion, wherein the first pad portion overlaps the input insulation layer, and the second pad portion does not overlap the input insulation layer.

20 Claims, 15 Drawing Sheets

(56) References Cited

U.S. PATENT DOCUMENTS

2019/0064979 A1\* 2/2019 Liu .................... G06F 3/047

FOREIGN PATENT DOCUMENTS

| KR | 10-0922381 | 10/2009 |
| KR | 10-1057537 | 8/2011 |
| KR | 10-1409286 | 6/2014 |
| KR | 10-2017-0081058 | 7/2017 |

\* cited by examiner

DISPLAY DEVICE

CROSS-REFERENCE TO RELATED APPLICATIONS

This U.S. non-provisional patent application claims priority under 35 U.S.C. § 119 to Korean Patent Application No. 10-2019-0052827, filed on May 7, 2019, the disclosure of which is incorporated by reference herein in its entirety.

TECHNICAL FIELD

Exemplary embodiments of the present inventive concept relate to a display device, and more particularly, to a display device including an input sensing layer.

DISCUSSION OF THE RELATED ART

Various display devices used in multimedia equipment such as televisions, mobile phones, table computers, navigation devices, and game consoles are being developed. The display device may include a display module, a polarizing layer disposed on the display panel, and a window. The display module may display an image and sense an external input. The display module may include a display panel to display an image and an input sensing layer to sense an external input.

SUMMARY

According to an exemplary embodiment of the present inventive concept, a display device includes: a base layer including a display area and a non-display area adjacent to the display area; a circuit element layer disposed on the base layer; a display element layer overlapping the display area and disposed on the circuit element layer; a plurality of signal pads overlapping the non-display area and disposed on the base layer, wherein the plurality of signal pads are spaced a predetermined interval from each other in a first direction, and are electrically connected to the circuit element layer; and an input sensing layer including a conductive layer and an input insulation layer, wherein the conductive layer is disposed on the display element layer, and the input insulation layer covers the conductive layer and a portion of each of the signal pads. Each of the signal pads includes a first pad portion and a second pad portion, wherein the first pad portion overlaps the input insulation layer, and the second pad portion does not overlap the input insulation layer.

In an exemplary embodiment of the present inventive concept, the first pad portion and the second pad portion are alternately arranged in a second direction substantially perpendicular to the first direction.

In an exemplary embodiment of the present inventive concept, the signal pads include a first signal pad and a second signal pad adjacent to the first signal pad, and the first pad portion of the first signal pad overlaps the second pad portion of the second signal pad in the first direction, and the second pad portion of the first signal pad overlaps the first pad portion of the second signal pad in the first direction.

In an exemplary embodiment of the present inventive concept, the first pad portion is of a plurality of first pad portions of each of the signal pads, and the second pad portion is of a plurality of second pad portions of each of the signal pads, wherein the plurality of first pad portions and the plurality of second pad portions are alternately arranged in the second direction.

In an exemplary embodiment of the present inventive concept, the input insulation layer entirely overlaps the first pad portion.

In an exemplary embodiment of the present inventive concept, the display device further includes a circuit board including a plurality of connection pads that are electrically connected to the signal pads, respectively, wherein the second pad portion of each of the signal pads is electrically connected to a corresponding connection pad of the connection pads.

In an exemplary embodiment of the present inventive concept, the input insulation layer includes a pad opening exposing the second pad portion, and the display device further includes an anisotropic conductive film disposed between the signal pads and the connection pads, wherein the anisotropic conductive film electrically connects the second pad portion of each of the signal pads to the corresponding connection pad through the pad opening.

In an exemplary embodiment of the present inventive concept, each of the signal pads includes: a first pad electrode electrically connected to the display element layer and disposed on the base layer; a first pad insulation layer covering the first pad electrode and disposed on the base layer, wherein a plurality of contact holes are formed in the first pad insulation layer; and a second pad electrode disposed on the first pad insulation layer and electrically connected to the first pad electrode through the plurality of contact holes, wherein the second pad electrode of each of the signal pads forms the first pad portion and the second pad portion.

In an exemplary embodiment of the present inventive concept, a portion of the second pad electrode corresponding to the first pad portion is entirely covered by the input insulation layer.

In an exemplary embodiment of the present inventive concept, the contact holes are spaced apart from each other and arranged in a second direction substantially perpendicular to the first direction.

In an exemplary embodiment of the present inventive concept, a first contact hole of the plurality of contact holes and a second contact hole, adjacent to the first contact hole, of the plurality of contact holes overlap the first pad portion and the second pad portion, respectively.

In an exemplary embodiment of the present inventive concept, first and second contact holes of the plurality of contact holes form a first contact hole part, and third and fourth contact holes of the plurality of contact holes form a second contact hole part, and the first contact hole part overlaps the first pad portion, and the second contact hole part overlaps the second pad portion.

In an exemplary embodiment of the present inventive concept, the conductive layer includes a first conductive pattern and a second conductive pattern, and the input insulation layer includes: a first input insulation layer covering the first conductive pattern disposed on the display element layer; and a second input insulation layer covering the second conductive pattern disposed on the first input insulation layer, wherein the second input insulation layer covers the first pad portion.

In an exemplary embodiment of the present inventive concept, the input insulation layer further includes a sub input insulation layer disposed between the display element layer and the first input insulation layer.

In an exemplary embodiment of the present inventive concept, each of the signal pads further includes a second pad insulation layer disposed on the first pad insulation layer, and the plurality of contact holes pass through the first pad insulation layer and the second pad insulation layer.

In an exemplary embodiment of the present inventive concept, the second pad insulation layer and the sub input insulation layer are connected to each other and disposed on the same layer.

In an exemplary embodiment of the present inventive concept, each of the first pad insulation layer and the second input insulation layer includes an organic material, and the second pad insulation layer includes an inorganic material.

In an exemplary embodiment of the present inventive concept, the second conductive pattern and the second pad electrode are respectively disposed on the first input insulation layer and the first pad insulation layer through the same process.

In an exemplary embodiment of the present inventive concept, the circuit element layer includes a signal line electrically connected to the display element layer, and one end of the signal line contacts the first pad electrode.

In an exemplary embodiment of the present inventive concept, a first length from a top surface of the base layer to a top surface of the input insulation layer is greater than a second length from the top surface of the base layer to a top surface of the second pad portion of each of the signal pads.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Figure 1:
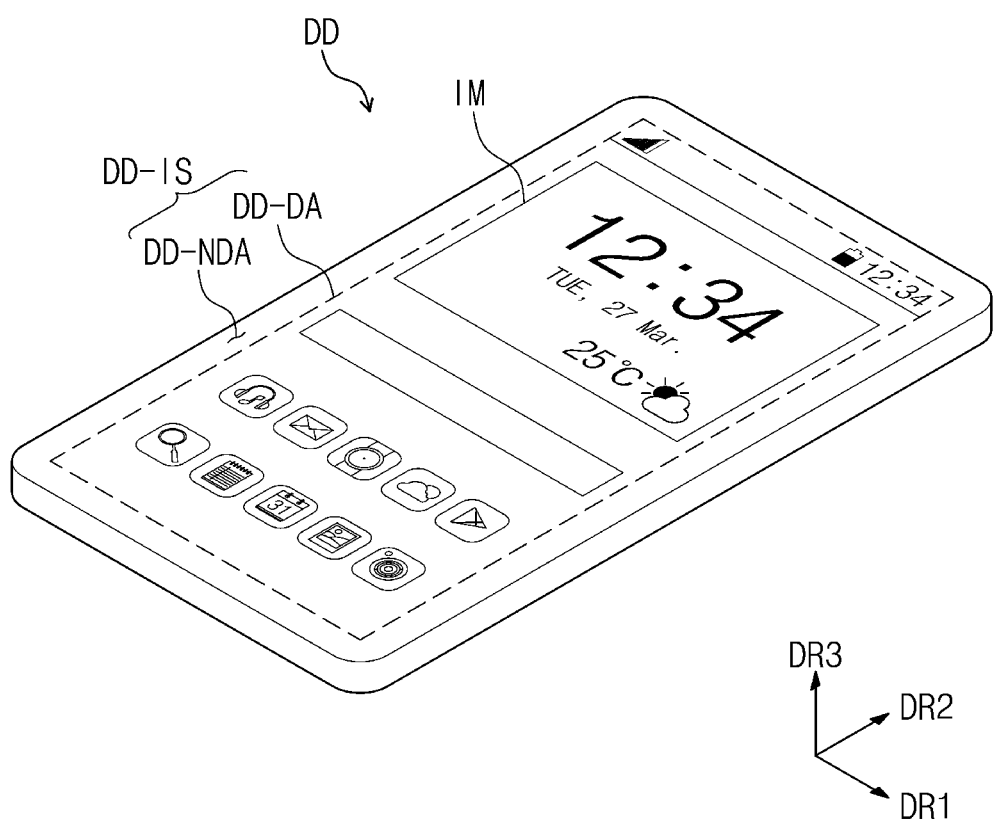
FIG. 1 is a perspective view of a display device according to an exemplary embodiment of the present inventive concept.

In this specification, it will be understood that when one component (or region, layer, portion) is referred to as being 'on', 'connected to', or 'coupled to' another component, it can be directly disposed/connected/coupled on/to the other component, or an intervening third component may also be present.

It is to be understood that like reference numerals refer to like elements throughout the specification. In addition, in the figures, the thicknesses, ratios, and dimensions of layer, regions, and components may be exaggerated for clarity of illustration.

The term "and/or" includes any and all combinations of one or more of the associated listed items.

It will be understood that although the terms such as 'first' and 'second' may be used herein to describe various elements, these elements should not be limited by these terms. The terms are only used to distinguish one component from other components. For example, an element referred to as a first element in one embodiment can be referred to as a second element in another embodiment without departing from the spirit and scope of the present inventive concept. The terms of a singular form may include plural forms unless referred to the contrary.

In addition, spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, in the example, terms "below" and "beneath" may encompass both an orientation of above, below and beneath. The device may be otherwise oriented (e.g., rotated 90 degrees or at other orientations) and the spatially relative descriptors used herein may be interpreted accordingly.

Hereinafter, exemplary embodiments of the present inventive concept will be described with reference to the accompanying drawings.

Figure 2:
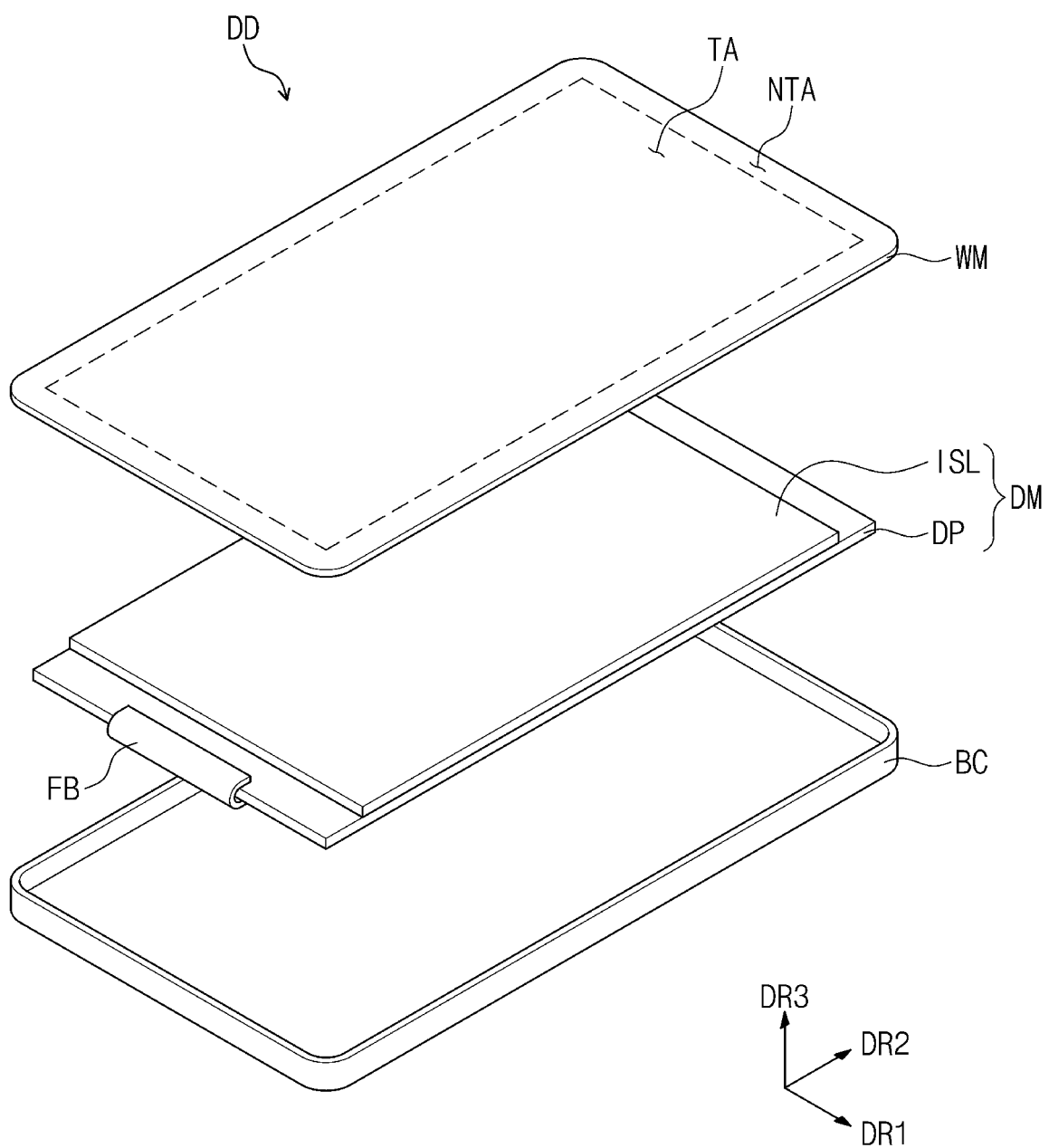
FIG. 2 is an exploded perspective view of the display device according to an exemplary embodiment of the present inventive concept.

FIG. 1 is a perspective view of a display device according to an exemplary embodiment of the present inventive concept. FIG. 2 is an exploded perspective view of the display device according to an exemplary embodiment of the present inventive concept.

Referring to FIG. 1, a display device DD may display an image IM through a display surface DD-IS. According to an exemplary embodiment of the inventive concept, although the display device DD includes a planar display surface DD-IS, the preset inventive concept is not limited thereto. The display device DD may include a curved display surface. For example, the curved display surface may include a plurality of display areas that face different directions. In addition, the display device DD may include a bendable display surface, and the display surface may be bendable in different directions.

According to an exemplary embodiment of the present inventive concept, the display device DD may be provided as a flexible display device. However, the present embodiment of the present inventive concept is not limited thereto. For example, the display device DD according to an exemplary embodiment of the present inventive concept may be provided as a rigid display device.

In addition, electronic modules, a camera module, a power module, and the like, which are mounted on a main board, may be disposed on a bracket/case together with the display device DD to constitute a mobile terminal. The display apparatus DD according to an exemplary embodiment of the present inventive concept may be applied to large-sized electronic apparatuses such as televisions and monitors and small and middle-sized electronic apparatuses such as tablet PC, navigation units for vehicles, game consoles, and smart watches.

The display surface DD-IS may be parallel to a surface provided by a first direction DR1 and a second direction DR2. A normal direction of the display surface DD-S, e.g., a thickness direction of the display device DD is indicated as a third direction DR3. In this specification, "when viewed on a plane, or a planar area" may mean a case when viewed in the third direction DR3. A front surface (or, e.g., a top surface) and a rear surface (or, e.g., a bottom surface) of each of members or units, which will be described below, are distinguished by the third direction DR3. However, the first to third directions DR1, DR2, and DR3 shown in this embodiment may be examples, and directions indicated by the first to third directions DR1, DR2, and DR3 may be changed into opposite directions.

As illustrated in FIG. 1, the display surface DD-IS includes a display area DD-DA on which an image IM is displayed and a non-display area DD-NDA adjacent to the display area DD-DA. The non-display area DD-NDA may be an area on which an image is not displayed. Application icons and a watch window are illustrated as an example of the image IM in FIG. 1.

In addition, the display area DD-DA has a rectangular shape, and the non-display area DD-NDA at least partially surrounds the display area DD-DA. However, exemplary embodiments of the present inventive concept are not limited thereto. For example, the display area DD-DA and the non-display area DD-NDA may be relatively designed in shape. For example, the non-display area DD-NDA may be disposed adjacent to only one side of the display area DD-DA or may be omitted.

Referring to FIG. 2, the display device DD may include a window WM, a display module DM, a circuit board FB, and an accommodating member BC.

The window WM may be disposed on the display module DM to transmit an image provided from the display module DM through a transmission area TA. For example, the window WM may be disposed above the display module DM. The window WM includes a transmission area TA and a non-transmission area NTA. The transmission area TA may have a shape corresponding to that of the display area DD-DA illustrated in FIG. 1. For example, an image IM displayed on the display area DD-DA of the display device DD may be visible through the transmission area TA of the window WM from the outside.

The non-transmission area NTA may have a shape corresponding to that of the non-display area DD-NDA. The non-transmission area NTA may be an area having a light transmittance that is less than that of the transmission area TA. However, the present inventive concept is not limited thereto, and the non-transmission area NTA may be omitted.

For example, the window WM may be made of glass, sapphire, or plastic. In addition, although the window WM is provided as a single layer, the window WM may include a plurality of layers. The window WM may include a base layer and at least one printed layer overlapping the non-transmission area NTA and disposed on a rear surface of the base layer. The printed layer may have a predetermined color. For example, the printed layer may have a black color or have other colors except for the black color.

The display module DM is disposed between the window WM and the accommodation member BC. The display module DM includes a display panel DP and an input sensing layer ISL.

The display panel DP generates an image to transmit the generated image to the window WM. According to an exemplary embodiment of the present inventive concept, the display panel DP may be an organic light emitting display panel, a liquid crystal display panel, or a quantum dot light emitting display panel, but the present inventive concept is not limited thereto. For example, the organic light emitting display panel includes organic light emitting elements. The liquid crystal display panel includes liquid crystal molecules. The quantum dot light emitting display panel includes a quantum dot and a quantum rod.

Hereinafter, the organic light emitting display panel will be described as an example of the display panel DP according to an exemplary embodiment of the present inventive concept. However, the present inventive concept is not limited thereto, and various display panels may be applied to the present inventive concept according to an exemplary embodiment.

The input sensing layer ISL may be disposed between the window WM and the display panel DP. The input sensing layer ISL senses an input applied from the outside. The input applied from the outside may be provided in various manners. For example, the external input includes various types of external inputs such as a portion of user's body, a stylus pen, light, heat, pressure, or the like. In addition, an input through contact with the portion of the human body such as user's hands as well as adjacent or neighboring space touches (for example, hovering) may also be one form of an input.

The input sensing layer ISL may be disposed on the display panel DP. For example, the input sensing layer ISL may be directly disposed on the display panel DP. In this specification, that "a constituent A is directly disposed on a constituent B" may mean that an adhesion member is not disposed between the constituents A and B. In the present embodiment, the input sensing layer ISL may be manufactured together with the display panel DP through a continuous process. However, the present inventive concept is not limited thereto. For example, the input sensing layer ISL may be provided as an individual panel and then be coupled to the display panel DP through an adhesion layer. For another example, the input sensing layer ISL may be omitted.

The circuit board FB may be connected to one end of the display panel DP to transmit a driving signal to the display panel DP. According to an exemplary embodiment of the present inventive concept, the circuit board FB may be a flexible circuit board. The driving signal may be signal through which an image is displayed on the display panel DP. In addition, a driving circuit board providing the driving signal may be connected to one end of the circuit board FB. The circuit board FB may be disposed between the display panel DP and the driving circuit board to transmit the driving signal provided from the driving circuit board to the display panel DP.

Although only a structure in which the circuit board FP is connected to the display panel DP is illustrated in FIG. 2, the present embodiment of the present inventive concept is not limited thereto. For example, the display device DD may further include a touch circuit board connected to the input sensing layer ISL. The touch circuit board may provide a touch driving signal to the input sensing layer ISL. In addition, a bonding manner of connecting the circuit board FB to the display panel DP according to an exemplary embodiment of the present inventive concept may be substantially the same as a bonding manner of connecting the touch circuit board to the input sensing layer.

The accommodation member BC may be coupled to the window WM. The accommodation member BC may be disposed on a rear surface of the display device DD and be coupled to the window WM to provide an internal space. The accommodation member BC may include a material having relatively high rigidity. For example, the accommodation member BC may include a plurality of frames and/or plates, which are made of glass, plastic, and/or metal. The accommodation member BC may stably protect the constituents of the display device DD, which are accommodated in the internal space, against an external impact.

In addition, although the accommodation member BC includes the material having the high rigidity, the present embodiment of the present inventive concept is not limited thereto. The accommodation member BC may include a flexible material. The display device DD according to an exemplary embodiment of the present inventive concept may have foldable or bendable properties. As a result, the constituents provided in the display device DD may also have flexible properties.

Figure 3:
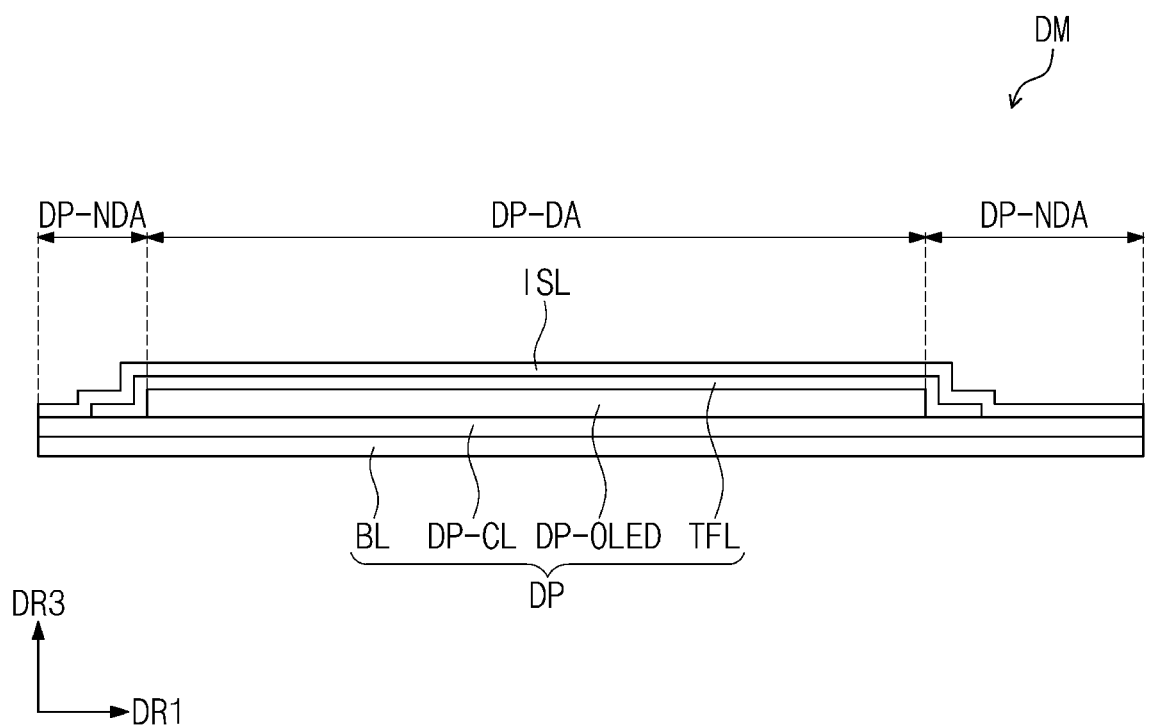
FIG. 3 is a cross-sectional view of a display module according to an exemplary embodiment of the present inventive concept.

FIG. 3 is a cross-sectional view of the display module according to an exemplary embodiment of the present inventive concept.

Referring to FIG. 3, the display panel DP includes a base layer BL, a circuit element layer DP-CL disposed on the base layer BL, a display element layer DP-OLED, and an encapsulation layer TFL.

The base layer BL may include at least one plastic film. The base layer BL may include a plastic substrate, a glass substrate, a metal substrate, or an organic/inorganic composite substrate as a flexible substrate. The display area DD-DA and the non-display area DD-NDA, which are described with reference to FIG. 1, may correspond to a display area DP-DA and a non-display area DP-NDA, which are provided on the base layer BL, respectively. Hereinafter, the base layer BL may be described as a display substrate.

The circuit element layer DP-CL includes at least one intermediate insulation layer and a circuit element. The intermediate insulation layer includes at least one intermediate inorganic film and at least one intermediate organic film. The circuit element includes signal lines, a driving circuit of a pixel, and the like.

The display element layer DP-OLED may include a plurality of organic light emitting diodes. The display element layer DP-OLED may further include an organic layer such as a pixel defining layer. According to an exemplary embodiment of the present inventive concept, when the display panel is provided as a liquid crystal display panel, the display element layer may be provided as a liquid crystal layer.

The encapsulation layer TFL seals the display element layer DP-OLED. For example, the encapsulation layer TFL may be a thin film encapsulation layer. The encapsulation layer TFL may protect the display element layer DP-OLED against foreign substances such as moisture, oxygen, and dust particles. Referring to FIG. 3, although the encapsulation layer TFL overlaps each of the display area DP-DA and the non-display area DP-NDA, the present embodiment of the present inventive concept is not limited thereto. For example, the encapsulation layer TFL may not overlap the non-display area DP-NDA.

Figure 4:
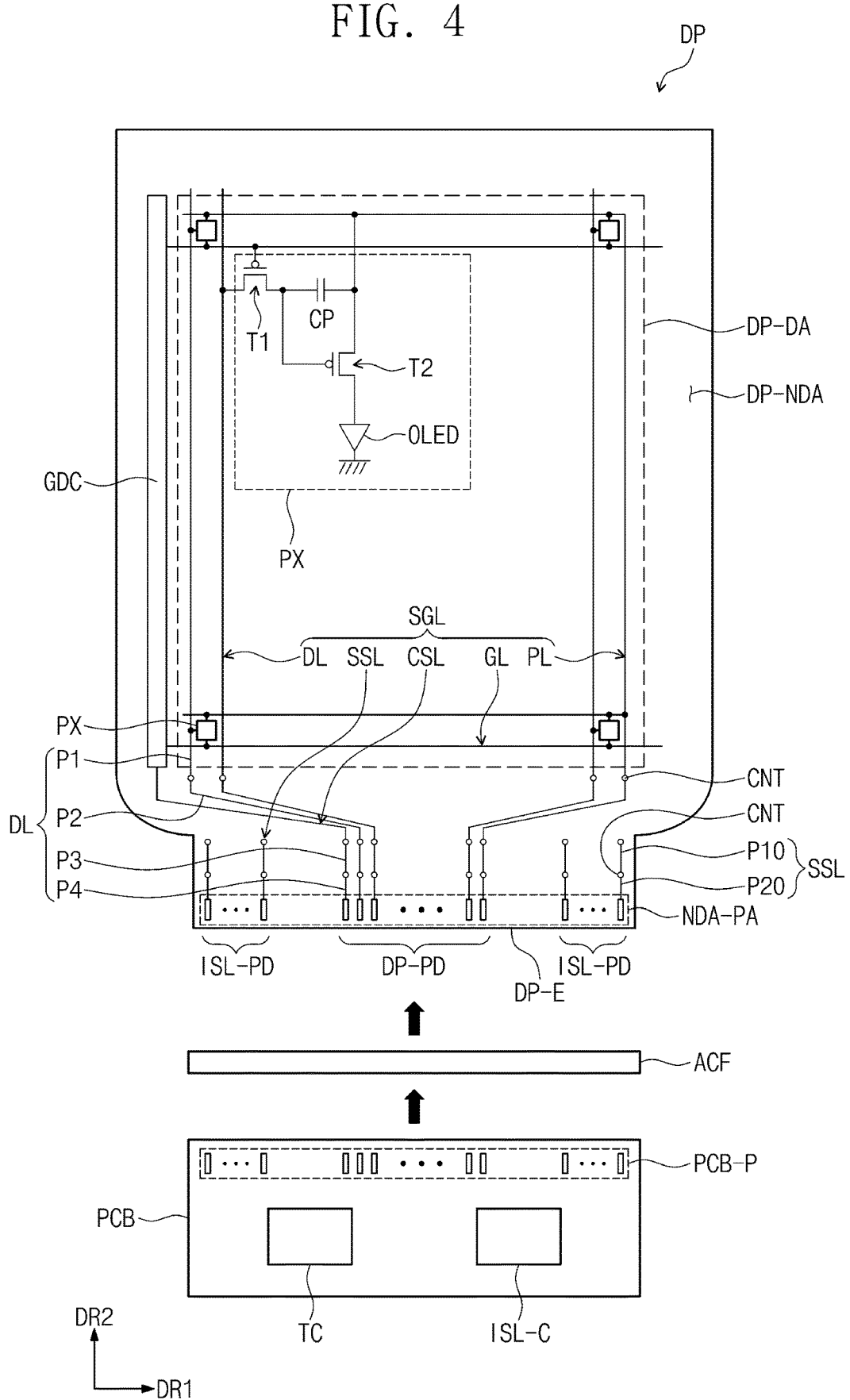
FIG. 4 is a plan view of the display panel according to an exemplary embodiment of the present inventive concept.

FIG. 4 is a plan view of the display panel according to an exemplary embodiment of the present inventive concept.

Referring to FIG. 4, the display panel DP may include a driving circuit GDC, a plurality of signal lines SGL, a plurality of pads DP-PD and ISL-PD, and a plurality of pixels PX.

The driving circuit GDC may include a scan driving circuit. The scan driving circuit generates a plurality of scan signals (hereinafter, referred to as scan signals). The scan signals are sequentially output to a plurality of scan lines GL (hereinafter, referred to as scan lines) that will be described later. The scan driving circuit may further output other control signals to the driving circuit of each of the pixels PX.

The scan driving unit may include a plurality of thin-film transistors that are manufactured through the same process as the driving circuit of the pixel PX, e.g., a low temperature polycrystalline silicon (LTPS) process or a low temperature polycrystalline oxide (LTPO) process.

The signal lines SGL include scan lines GL, data lines DL, a power line PL, and a control signal line CSL. The scan lines GL are respectively connected to corresponding pixels of the pixels PX, and the data lines DL are respectively connected to corresponding pixels PX of the pixels PX. The power line PL is connected to the pixels PX. The control signal line CSL may provide control signals to the scan driving circuit.

In the present embodiment, the signal lines SGL may further include auxiliary lines SSL. The auxiliary lines SSL may be signal lines connected to the input sensing layer ISL (see, e.g., FIG. 2). In an exemplary embodiment of the present inventive concept, the auxiliary lines SSL may be omitted.

The signal lines SGL may include a plurality of portions disposed on different layers. FIG. 4 illustrates an example in which the data lines DL include four portions P1 to P4, and the auxiliary lines SSL include two portions P10 to P20. The four portions P1 to P4 may be connected to each other through contact holes CNT, and the two portions P10 and P20 may be connected to each other through the contact holes CNT. The first portion P10 of the auxiliary lines SSL is connected to the signal line of the input sensing layer ISL (see, e.g., FIG. 6B), which will be described below, through the contact holes CNT.

The first signal pads DP-PD of the signal pads DP-PD and ISL-PD are connected to the data lines DL, the power line PL, and the control signal line CSL. The second signal pads ISL-PD of the signal pads DP-PD and ISL-PD are connected to the auxiliary lines SSL. The first signal pads DP-PD and the second signal pads ISL-PD are disposed adjacent to each other on a pad area NDA-PA provided on a portion of the non-display area DP-NDA. The pad area NDA-PA may be adjacent to an edge DP-E of the display panel DP. The signal pads DP-PD and ISL-PD may be formed through the same process without distinguishing lamination structures or constituent materials from each other. However, the present inventive concept is not limited thereto, and for example, the signal pads DP-PD and ISL-PD may be formed through separate processes.

Each of the signal pads DP-PD and ISL-PD may be exposed to an external space to be bonded to connection pads PCB-P of the circuit board PCB, which will be described later. In this case, when an external conductive foreign substance is between two signal pads (DP-PD and/or ISL-PD) adjacent to each other and is within a relatively close proximity of the two adjacent signal pads (DP-PD and/or ISL-PD), a short circuit may occur between the two signal pads (DP-PD and/or ISL-PD) adjacent to each other.

According to an exemplary embodiment of the present inventive concept, the two signal pads DP-PD and ISL-PD adjacent to each other among the signal pads DP-PD and ISL-PD may be prevented from being short-circuited through the insulation layer covering a portion of each of the signal pads DP-PD and ISL-PD.

For example, each of the signal pads DP-PD and ISL-PD may be divided into a first pad portion and a second pad portion. For example, the first pad portion of each of the signal pads DP-PD and ISL-PD may be covered by an insulation layer, and the second pad portion of each of the signal pads DP-PD and ISL-PD may be exposed to the outside through a pad opening provided in the insulation layer. The display panel DP and the circuit board PCB may be electrically connected with each other through the second pad portion of each of the signal pads DP-PD and ISL-PD exposed through the pad opening.

For example, the insulation layer may have a thickness greater than that of the second pad portion of each of the signal pads DP-PD and ISL-PD. On the plane, the second pad portion of each of the signal pads DP-PD and ISL-PD may be surrounded by the insulation layer, and thus, the external conductive foreign substance may not contact the signal pads DP-PD and ISL-PD by the insulation layer. This will be described later in more detail with reference to FIG. 7A.

The display area DP-DA may be an area on which the pixels PX are disposed. A plurality of electronic elements may be disposed on the display area DP-DA. The electronic elements include an organic light emitting diode provided in each of the pixels PX and a pixel driving circuit connected to the organic light emitting diode. The driving circuit GDC, the signal lines SGL, the signal pads DP-PD and ISL-PD, and the pixel driving circuit may be included in the circuit element layer DP-CL illustrated in FIG. 3.

For example, the pixel PX may include a first transistor T1, a second transistor T2, a capacitor CP, and an organic light emitting diode OLED. The pixel driving circuit may include a switching transistor and a driving transistor, but the present inventive concept is not limited to the embodiment described with reference to FIG. 4. The first transistor T1 is connected to the scan line GL and the data line DL. The organic light emitting diode OLED receives a power voltage provided from the power line PL.

In FIG. 4, the circuit board PCB electrically connected to the display panel DP is additionally illustrated. For example, the circuit board PCB may be a rigid circuit board or a flexible circuit board.

A timing control circuit TC controlling an operation of the display panel DP may be disposed on the circuit board PCB. In addition, an input sensing circuit ISL-C controlling the input sensing layer ISL may be disposed on the circuit board PCB. Each of the timing control circuit TC and the input sensing circuit ISL-C may be mounted on the circuit board PCB in the form of an integrated chip.

The timing control circuit TC and the input sensing circuit ISL-C according to an exemplary embodiment of the present inventive concept may be mounted on the circuit board PCB in the form of one integrated chip. The circuit board PCB may include connection pads PCB-P electrically connected to the signal pads DP-PD and ISL-PD. The circuit board PCB may further include signal lines connecting the connection pads PCB-P to the timing control circuit TC and/or the input sensing circuit ISL-C. In addition, the connection pads PCB-P illustrated in FIG. 4 may be output pads electrically connected to the display panel DP, and the circuit board PCB may further include an input pad.

The signal pads DP-PD and ISL-PD of the display panel DP and the connection pads PCB-P of the circuit board PCB may be electrically connected to each other through a conductive material such as an anisotropic conductive film ACF. In an exemplary embodiment of the present inventive concept, the anisotropic conductive film ACF may include a conductive ball.

In addition, at least a portion of the display panel DP illustrated in FIG. 4 may be bent. For example, a portion of the non-display area DP-NDA may be bent along a bending axis parallel to a first direction DR1. The banding axis may overlap the third portions P3 of the data lines DL and the first portion P10 of the auxiliary lines SSL.

Figure 5A:
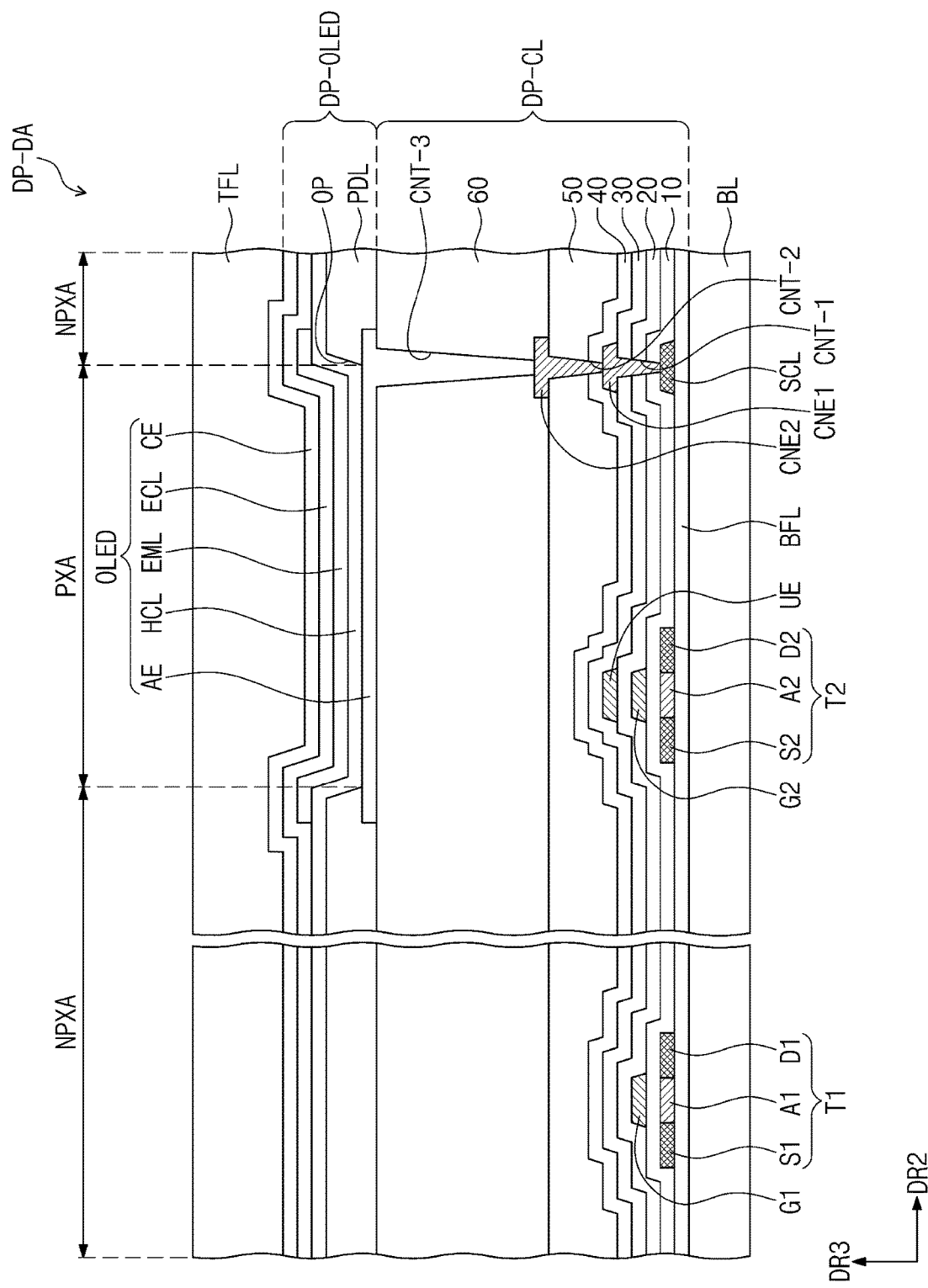
FIG. 5A is an enlarged cross-sectional view of the display panel according to an exemplary embodiment of the present inventive concept.
Figure 5B:
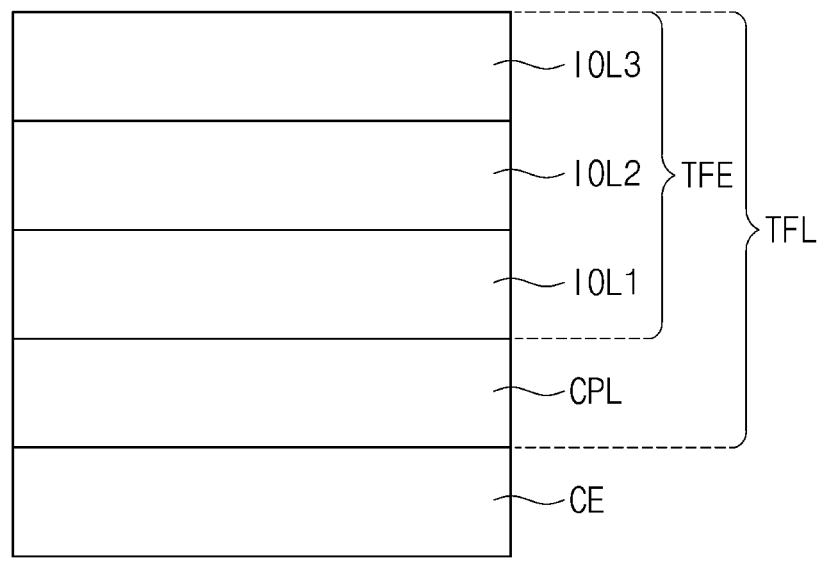
FIG. 5B is an enlarged cross-sectional view of an encapsulation layer according to an exemplary embodiment of the present inventive concept.

FIG. 5A is an enlarged cross-sectional view of the display panel according to an exemplary embodiment of the present inventive concept. FIG. 5B is an enlarged cross-sectional view of the encapsulation layer according to an exemplary embodiment of the present inventive concept.

Referring to FIG. 5A, the display panel DP may include a plurality of insulation layers, a semiconductor pattern, a conductive pattern, a signal line, and the like. The insulation layer, the semiconductor layer, and the conductive layer may be formed through methods such as coating, deposition, and the like. Thereafter, the insulation layer, the semiconductor layer, and the conductive layer may be selectively patterned in a photolithography manner. The semiconductor pattern, the conductive pattern, and the signal line, which are provided in the circuit element layer DP-CL and the display element layer DP-OLED, may be formed in the above-described manner.

The base layer BL may include a synthetic resin film. The synthetic resin layer may include a thermosetting resin. The base layer BL may have a multi-layered structure. For example, the base layer BL may have a three-layer structure of a synthetic resin layer, an adhesion layer, and a synthetic resin layer. For example, the synthetic resin layer may be a polyimide resin layer, and the material thereof is not limited thereto. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and/or a perylene-based resin. In addition, the synthetic resin layer may include a glass substrate, a metal substrate, or an organic/inorganic composite substrate.

At least one inorganic layer may be disposed on a top surface of the base layer BL. The inorganic layer may include at least one of oxide, titanium oxide, silicon oxide, silicon oxide nitride, zirconium oxide, or hafnium oxide. The inorganic layer may be provided as a multilayer. The multi-layered inorganic layer may constitute a barrier layer and/or a buffer layer. In the present embodiment, the display panel DP may include the buffer layer BFL.

The buffer layer BFL may increase bonding force between the base layer BL and the semiconductor pattern. The buffer layer BFL may include a silicon oxide layer and a silicon nitride layer. The silicon oxide layer and the silicon nitride layer may be alternately laminated.

The semiconductor pattern is disposed on the buffer layer BFL. For example, the semiconductor pattern may include polysilicon. However, the present inventive concept is not limited thereto. For example, the semiconductor pattern may include amorphous silicon or metal oxide.

FIG. 5A illustrates a portion of the semiconductor pattern. For example, the semiconductor pattern may be further disposed on other areas of the pixel PX on the plane. The semiconductor pattern may be arranged in a predetermined arrangement over the pixels PX. The semiconductor pattern has different electrical properties depending on whether the semiconductor pattern is doped. The semiconductor pattern may include a doped region and a non-doped region. The doped region may be doped with an N-type dopant or a P-type dopant. A P-type transistor includes a doped region into which the P-type dopant is doped. An N-type transistor includes a doped region into which the N-type dopant is doped.

The doped region may have conductivity greater than that of the non-doped region and substantially act as an electrode or a signal line. The non-doped region may substantially correspond to an active (or, e.g., a channel) of the transistor. For example, a portion of the semiconductor pattern may be an active portion of the transistor, another portion may be a source or drain of the transistor, and another portion may be a connection electrode or a connection signal line.

As illustrated in FIG. 5A, a source S1, an active A1, and a drain D1 of a first transistor T1 may be formed from the semiconductor pattern, and a source S2, an active A2, and a drain D2 of the second transistor T2 of the second transistor T2 may be formed from the semiconductor pattern. The sources S1 and S2 and the drains D1 and D2 extend from the respective actives A1 and A2 in directions opposite to each other. FIG. 5A illustrates a portion of the connection signal line SCL formed from the semiconductor pattern. The connection signal line SCL may be connected to the drain D2 of the second transistor T2 on the plane.

A first insulation layer 10 is disposed on the buffer layer BFL. The first insulation layer 10 overlaps the plurality of pixels PX (see, e.g., FIG. 4) and covers the semiconductor pattern. For example, the first insulation layer 10 may include an inorganic layer and/or an organic layer and have a single-layered or multi-layered structure. The first insulation layer 10 may include at least one of oxide, titanium oxide, silicon oxide, silicon oxide nitride, zirconium oxide, and/or hafnium oxide. In the present embodiment, the first insulation layer 10 may include a single-layered silicon oxide layer. The insulation layer of the circuit element layer DP-CL, which will be described later, as well as the first insulation layer 10 may be an inorganic layer and/or an organic layer and may have a single-layered or a multi-layered structure. The inorganic layer may include at least one of the above-described materials.

Gates G1 and G2 are disposed on the first insulation layer 10. Each of the gates G1 and G2 may be a portion of the metal pattern. The gates G and G2 respectively overlap the actives A1 and A2. In the process of doping the semiconductor pattern, the gates G and G2 may serve as masks.

A second insulation layer 20 covering the gates G1 and G2 is disposed on the first insulation layer 10. The second insulation layer 20 overlaps the pixels PX (see, e.g., FIG. 4). The second insulation layer 20 may include an inorganic layer and/or an organic layer and have a single-layered or multi-layered structure. In the present embodiment, the second insulation layer 20 may include a single-layered silicon oxide layer.

An upper electrode UE may be disposed on the second insulation layer 20. The upper electrode UE may overlap the gate G2 of the second transistor T2. The upper electrode UE may be a portion of the metal pattern. A portion of the gate G2 and the upper electrode UE overlapping the portion of the gate G2 may form a capacitor CP (see, e.g., FIG. 4). However, the present inventive concept is not limited thereto. In an exemplary embodiment of the present inventive concept, the upper electrode UE may be omitted.

A third insulation layer 30 covering the upper electrode UE is disposed on the second insulation layer 20. In the present embodiment, the third insulation layer 30 may be a single-layered silicon oxide layer. The first connection electrode E1 may be disposed on the third insulation layer 30. The first connection electrode CNE1 may be connected to the signal line SCL through a contact hole CNT-1 passing through the first to third insulation layers 10 to 30.

A fourth insulation layer 40 covering the first connection electrode CNE1 is disposed on the third insulation layer 30. For example, the fourth insulation layer 40 may be a single-layered silicon oxide layer. A fifth insulation layer 50 is disposed on the fourth insulation layer 40. For example, the fifth insulation layer 50 may be an organic layer. A second connection electrode CNE2 may be disposed on the fifth insulation layer 50. The second connection electrode CNE2 may be connected to the first connection electrode CNE1 through a contact hole CNT-2 passing through the fourth insulation 40 and the fifth insulation layer 50.

A sixth insulation layer 60 covering the second connection electrode CNE2 is disposed on the fifth insulation layer 50. For example, sixth insulation layer 60 may be an inorganic layer. A first electrode AE is disposed on the sixth insulation layer 60. The first electrode AE is connected to the second connection electrode CNE2 through a contact hole CNT-3 passing through the sixth insulation layer 60. An opening OP is provided in the pixel defining layer PDL. The opening OP of the pixel defining layer PDL exposes at least a portion of the first electrode AE.

As illustrated in FIG. 5A, the display area DP-PA may include an emission area PXA and a non-emission area NPXA adjacent to the emission area PXA. The non-emission area NPXA may at least partially surround the emission area PXA. In the present embodiment, the emission area PXA may correspond to a portion of an area of the first electrode AE exposed by the opening OP.

A hole control layer HCL may be disposed on the emission area PXA and the non-emission area NPXA. For example, the hole control layer HCL may be commonly disposed throughout the emission area PXA and the non-emission area NPXA. The hole control layer HCL may include a hole transport layer and may further include a hole injection layer. The emission layer EML is disposed on the hole control layer HCL. The emission layer EML may be disposed on an area of the hole control layer HCL corresponding to the opening OP. For example, each emission layer EML may be formed in a respective pixel PX and may be separate from other emission layers EML of other pixels PX.

An electronic control layer ECL is disposed on the emission layer EML. The electron control layer ECL may include an electron transport layer and may further include an electron injection layer. The hole control layer HCL and the electron control layer ECL may be formed on the plurality of pixels PX by using an open mask. For example, the hole control layer HCL and the electron control layer ECL may be commonly formed on the pixels PX. A second electrode CE is disposed on the electronic control layer ECL. For example, the second electrode CE is provided as a single body and commonly disposed on the plurality of pixels PX (see, e.g., FIG. 4).

As illustrated in FIGS. 5A and 5B, the encapsulation layer TFL is disposed on the second electrode CE. The encapsulation layer TFL may include a plurality of thin films. According to the present embodiment, the encapsulation layer TFL may include a capping layer CPL and a thin film encapsulation layer TFE. The thin film encapsulation layer TFE may include a first inorganic layer IOL1, an organic layer IOL2, and a second inorganic layer IOL3.

The capping layer CPL is disposed on the second electrode CE. For example, the capping layer CPL may be in contact with the second electrode CE. The capping layer CPL may include an organic material. The first inorganic layer IOL1 is disposed on the capping layer CPL. For example, the first inorganic layer IOL1 may contact the capping layer CPL. The organic layer IOL2 is disposed on the first inorganic layer IOL1. For example, the organic layer IOL2 may contact the first inorganic layer IOL1. The second inorganic layer IOL3 is disposed on the organic layer IOL2. For example, the second organic layer IOL3 may contact the organic layer IOL2.

The capping layer CPL may protect the second electrode CE from a follow-up process, for example, a sputtering process and increase emission efficiency of the organic light emitting diode OLED. The capping layer CPL may have a refractive index greater than that of the first inorganic layer IOL1.

The first inorganic layer IOL1 and the second inorganic layer IOL3 may protect the display element layer DP-OLED against oxygen/moisture, and the organic layer IOL2 may protect the display element layer DP-OLED against foreign substances such as dust particles. Each of the first inorganic layer IOL1 and the second inorganic layer IOL3 may be one of a silicon oxide layer, a silicon nitride layer, a silicon oxynitride layer, and/or a silicon oxide layer. According to an exemplary embodiment of the present inventive concept, each of the first inorganic layer IOL1 and the second inorganic layer IOL3 may include a titanium oxide layer, an aluminum oxide layer, and the like. The organic layer IOL2 may include an acrylic-based organic layer, but the present inventive concept is not limited thereto.

According to an exemplary embodiment of the present inventive concept, an inorganic layer, for example, a lithium fluoride (LiF) layer may be disposed between the capping layer CPL and the first inorganic layer IOL1. The LiF layer may increase emission efficiency of the organic light emitting diode OLED.

Figure 6A:
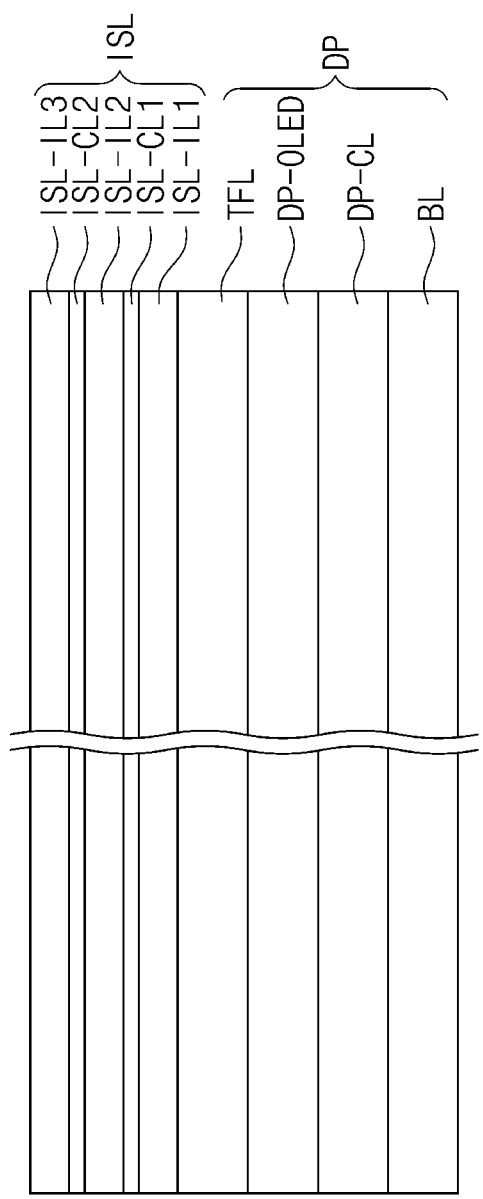
FIG. 6A is a cross-sectional view of an input sensing layer according to an exemplary embodiment of the present inventive concept.
Figure 6B:
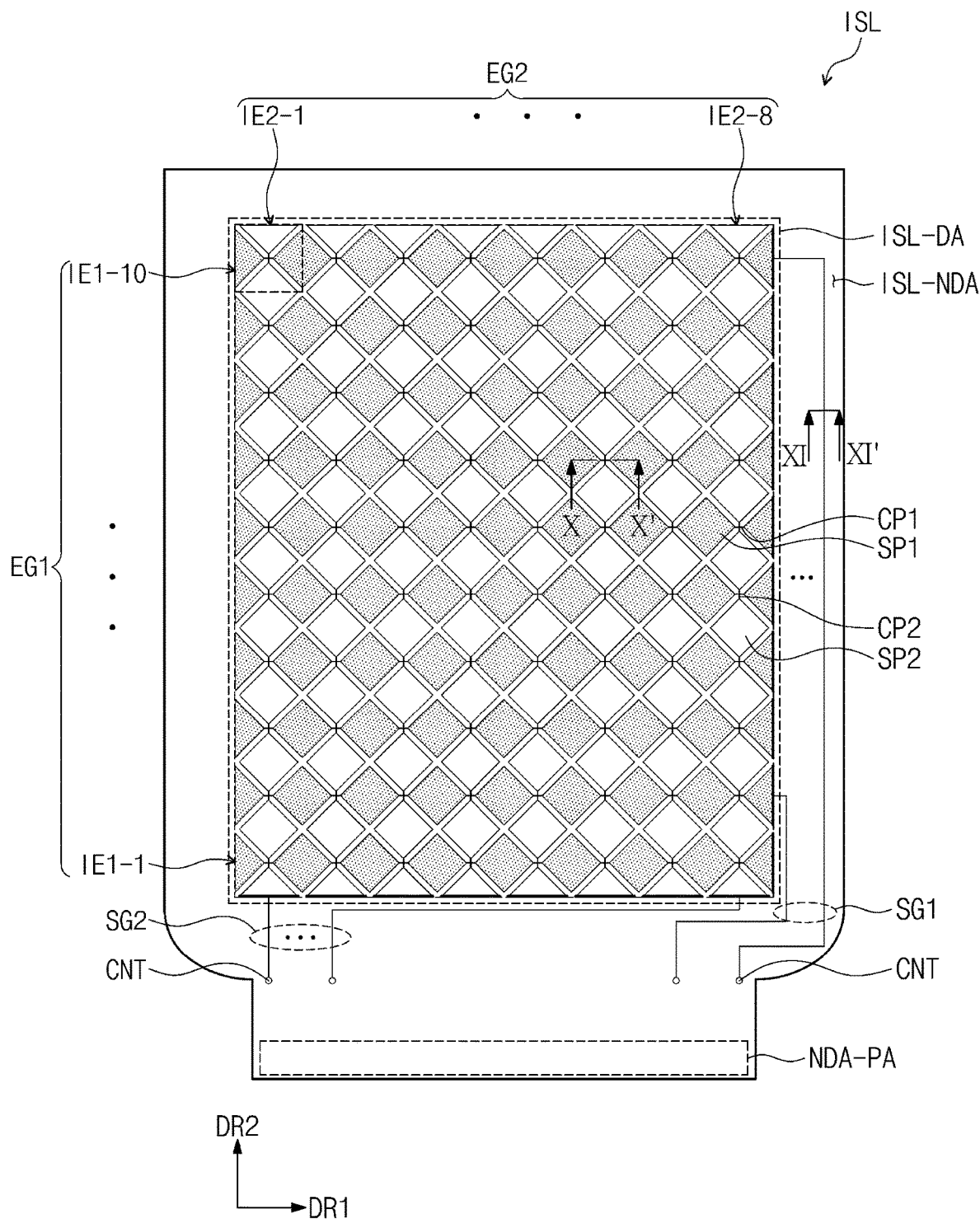
FIG. 6B is a plan view of the input sensing layer according to an exemplary embodiment of the present inventive concept.
Figure 6C:
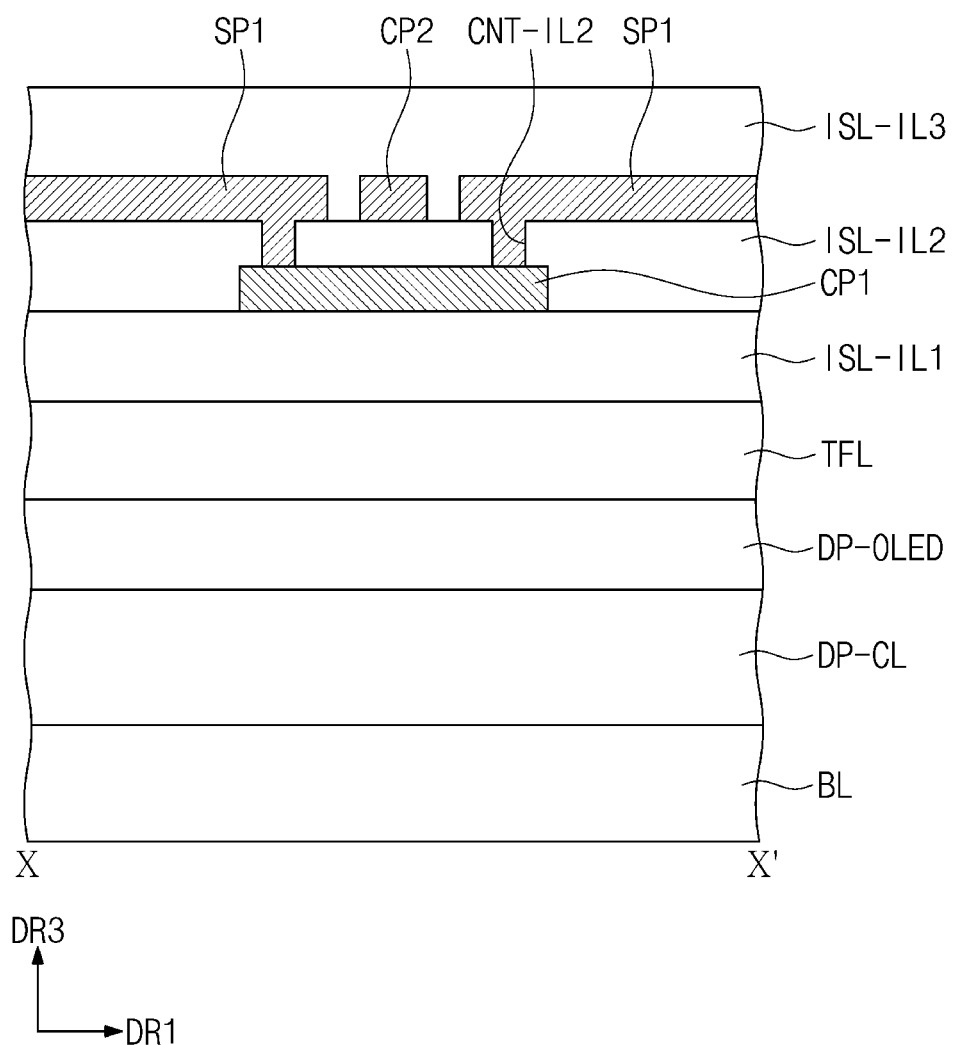
FIGS. 6C and 6D are partial cross-sectional views of the input sensing layer according to an exemplary embodiment of the present inventive concept.
Figure 6D:
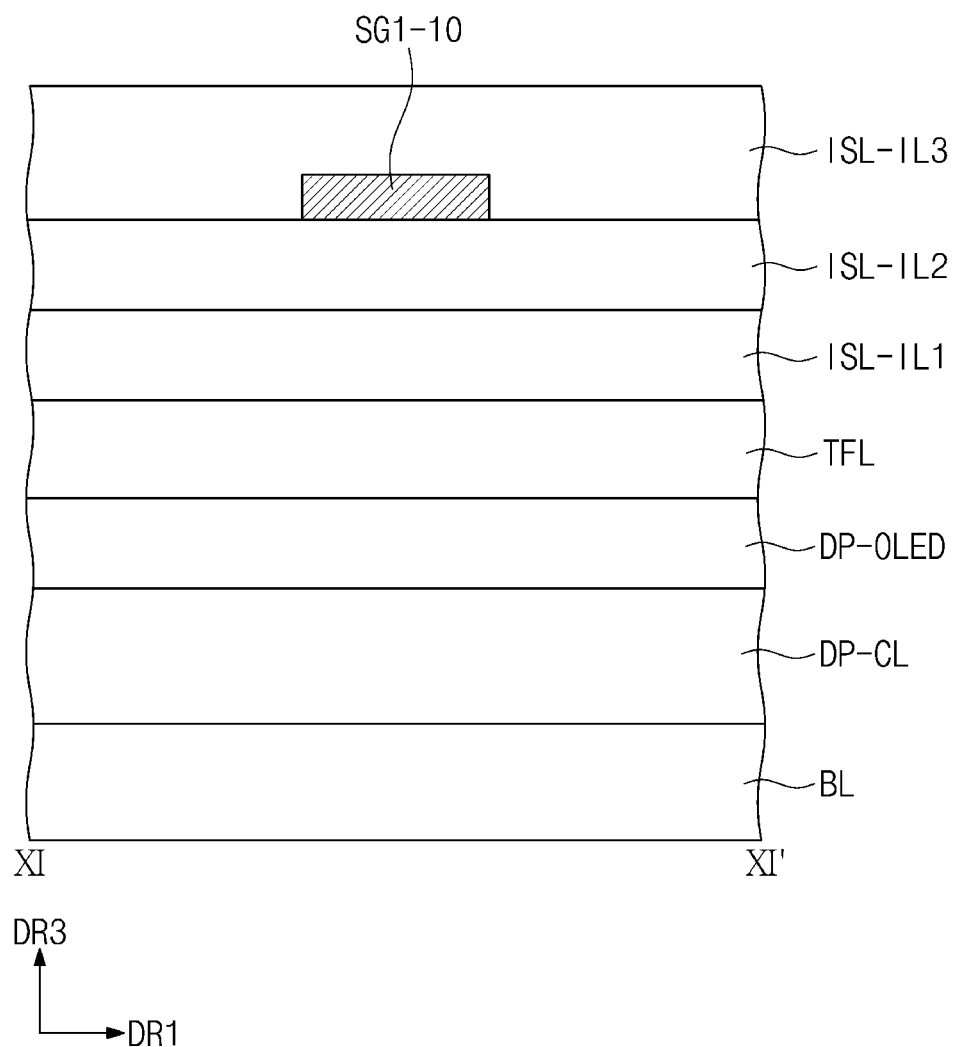

FIG. 6A is a cross-sectional view of the input sensing layer according to an exemplary embodiment of the present inventive concept. FIG. 6B is a plan view of the input sensing layer according to an exemplary embodiment of the present inventive concept. FIGS. 6C and 6D are partial cross-sectional views of the input sensing layer according to an exemplary embodiment of the present inventive concept.

Referring to FIG. 6A, the input sensing layer ISL may include a sub input insulation layer ISL-IL1, a first conductive layer ISL-CL1, a first input insulation layer ISL-IL2, a second conductive layer ISL-CL2, and a second input insulation layer ISL-IL3. The sub input insulation layer ISL-IL1 is disposed on the encapsulation layer TFL. For example, the sub input insulation layer ISL-IL1 may be directly disposed on the encapsulation layer TFL. In an exemplary embodiment of the present inventive concept, the sub input insulation layer ISL-IL1 may be omitted.

8 Each of the first conductive layer ISL-CL1 and the second conductive layer ISL-CL2 may have a single-layered structure or a multi-layered structure in which a plurality of layers are laminated in the third directional axis DR3. The conductive layer (e.g., ISL-CL1 and/or ISL-CL2) having the multilayer structure may include at least one transparent conductive layer and at least one metal layer. For example, the conductive layer having the multilayer structure may include metal layers including metals different from each other. However, the present inventive concept is not limited thereto, and the multilayer structure may include a plurality of different transparent conductive layers or a plurality of different metal layers. The transparent conductive layer may include, for example, indium tin oxide (ITO), indium zinc oxide (IZO), zinc oxide (ZnO), or indium tin zinc oxide (ITZO), PEDOT, a metal nano wire, and graphene. The metal layer may be formed of molybdenum, silver, titanium, copper, aluminum, and an alloy thereof. For example, each of the first and second conductive layers ISL-CL1 and ISL-CL2 may have a three-layered metal structure, for example, a three-layered structure of titanium/aluminum/titanium. A metal having relatively high durability and low reflectance may be applied to an outer layer of the metal structure, and a metal having high electrical conductivity may be applied to an inner layer of the metal structure.

Each of the first and second conductive layers ISL-CL1 and ISL-CL2 may include a plurality of patterns. Hereinafter, an example in which the first conductive layer ISL-CL1 includes first conductive patterns, and the second conducive layer ISL-CL2 includes second conductive patterns will be described. Each of the first and second conductive patterns may include sensing electrodes and signal lines connected to the sensing electrodes.

For example, the first conductive patterns may be disposed on the sub input insulation layer ISL-IL. The first input insulation layer ISL-IL2 may cover the first conductive patterns and be disposed on the sub input insulation layer ISL-IL. The second conductive patterns may be disposed on the first input insulation layer ISL-IL2. The second input insulation layer ISL-IL2 may cover the second conductive pattern and be disposed on the first input insulation layer ISL-IL2. The second input insulation layer ISL-IL3 may be the uppermost insulation layer of the input sensing layer ISL.

According to an exemplary embodiment of the present inventive concept, the second input insulation layer ISL-IL3 may be the same layer as the insulation layer covering the first pad portion of each of the signal pads DP-PD and ISL-PD that is described with reference to FIG. 4. For example, the second input insulation layer ISL-IL3 and the insulation layer covering the second pad portion of each of the signal pads DP-PD and ISL-PD may be connected to each other and formed simultaneously at once through the same process. However, the present inventive concept is not limited thereto, and the second input insulation layer ISL-IL3 and the insulation layer may be formed at different times.

Hereinafter, an example in which the second input insulation layer ISL-IL3 overlaps each of the display area DP-DA and the non-display area DP-NDA and covers the second conductive patterns and the second pad portion of each of the signal pads DP-PD and ISL-PD will be described.

Each of the sub input insulation layer ISL-IL1 to the second insulation layers ISL-IL3 may include an inorganic or organic layer. In the present embodiment, each of the sub insulation layer ISL-IL1 to the first insulation layers ISL-IL2 may be an inorganic layer. The inorganic layer may include at least one of, for example, oxide, titanium oxide, silicon oxide, silicon oxide nitride, zirconium oxide, and/or hafnium oxide. The second input insulation layer ISL-IL3 may include an organic layer. The organic layer may include at least one, for example, of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

As illustrated in FIG. 6, the input sensing layer ISL includes a first electrode group EG1, a second electrode group EG2, and signal line groups connected to the electrode groups EG1 and EG2. In the present embodiment, an example in which the input sensing layer ISL includes two signal line groups SG1 and SG2 is described. The input sensing layer ISL may include a sensing area ISL-DA and a line area ISL-NDA, which respectively correspond to the display area DP-DA and the non-display area DP-NDA of the display panel DP. The sensing area ISL-DA may be an area on which the first electrode group EG1 and the second electrode group EG2 are disposed. The first signal line group SG1 and the second signal line group SG2 are disposed on the line area ISL-NDA.

In the present embodiment, the input sensing layer ISL may be a capacitive touch sensor. One of the first electrode group EG1 and the second electrode group EG2 may receive a driving signal, and the other may output a variation in capacitance between the first electrode group EG1 and the second electrode group EG2 as a sensing signal. A driving section may be divided for driving. Here, the input sensing layer ISL may be driven as described above in the first driving section and be driven in reverse to the above-described driving manner in the second driving section.

The first electrode group EG1 includes a plurality of first sensing electrodes IE1-1 to IE1-10. An example in which the first electrode group EG1 includes ten first sensing electrodes IE1- to IE1-10 is illustrated. The first sensing electrode IE1-1 to IE1-10 may extend in the second direction DR2. The second electrode group EG2 includes a plurality of second sensing electrodes IE2-1 to IE2-8. An example in which the second electrode group EG2 includes eight second sensing electrodes IE2-1 to IE2-8 is illustrated. The second sensing electrodes IE2-1 to IE2-8 may extend in the first direction DR1. For example, each of the second sensing electrodes IE2-1 to IE2-8 has a length greater than that of the first sensing electrodes IE1-1 to IE1-10. However, the present inventive concept is not limited thereto.

The first signal line group SG1 may include the signal lines having the same number as the first sensing electrodes IE1-1 to IE1-10. The signal lines of the first signal line group SG1 may be connected to at least one end of both ends of each of the first sensing electrodes IE1-1 to IE1-10. The second signal line group SG2 may include the signal lines having the same number as the second sensing electrodes IE2-1 to IE2-8. The signal lines of the second signal line group SG2 may be connected to at least one end of both ends of each of the second sensing electrodes IE2-1 to IE2-8.

The signal lines of the first signal line group SG1 may be connected to a portion of the auxiliary lines SSL (see, e.g., FIG. 4) disposed on one side of the pad area NDA-PA through the contact holes CNT. The signal lines of the second signal line group SG2 may be connected to a portion of the auxiliary lines SSL (see, e.g., FIG. 4) disposed on the other side of the pad area NDA-PA through the contact holes CNT.

The contact holes CNT pass through the insulation layers disposed between the signal lines of the first signal line group SG1 and the auxiliary lines SSL. The contact holes CNT may pass through some of the first to sixth insulation layer 10 to 60 and pass through the sub input insulation layer ISL-IL and the first input insulation layer ISL-IL2 of the input sensing layer ISL.

Each of the first sensing electrodes IE1-1 to IE1-10 includes a plurality of first sensing parts SP1 and a plurality of first connection parts CP1. Each of the second sensing electrodes IE2-1 to IE2-8 includes a plurality of second sensing parts SP2 and a plurality of second connection parts CP2.

FIG. 6C is a cross-sectional view taken along line X-X' of FIG. 6B. FIG. 6C illustrates an example in which the first connection part CP1 and the second connection part CP2 cross each other. In the present embodiment, the first connection part CP1 may correspond to a bridge pattern. In an exemplary embodiment of the present inventive concept, the second connection part CP2 may be the bridge pattern.

As illustrated in FIGS. 6B and 6C, the plurality of first connection parts CP1 may be formed from the first conductive layer ISL-CL1, and the plurality of first sensing parts SP1, the plurality of second sensing parts SP2, and the plurality of second connection parts CP2 may be formed from the second conductive layer ISL-CL2. The first sensing parts SP1 and the first connection part CP1 may be connected to each other through contact holes CNT-IL2 passing through the first input insulation layer ISL-IL2.

In this embodiment, although the plurality of first connection parts CP1 and the plurality of second connection parts CP2 cross each other, the present embodiment of the present inventive concept is not limited thereto. For example, each of the first connection parts CP1 may be deformed into a "/\"-shaped curved line and/or a "\/"-shaped curved line so that the first connection parts CP1 do not overlap the second connection parts CP2. For example, the first connection parts CP1 may be bent in a third direction DR3. However, the present inventive concept is not limited thereto. The first connection parts CP1 having the "/\"-shaped curved line and/or a "\/"-shaped curved line may overlap the second sensing part SP2 on a plane.

According to an exemplary embodiment of the present inventive concept, the signal lines of the first signal line group SG1 and the second signal line group SG2 include at least one of a portion disposed on the same layer as the first sensing electrodes IE1-1 to IE1-10 and/or a portion disposed on the same layer as the second sensing electrode IE2-1 to IE2-8.

FIG. 6D is a cross-sectional view taken along line XI-XI' of FIG. 6B. 10-th signal lines SG1-10 of the first signal line group SG1 is illustrated as an example. The first signal line group SG1 may include a portion disposed on the same layer as at least the second sensing electrodes IE2-1 to IE2-8. The signal lines of the first signal line group SG1 and the second signal line group SG2 further include a portion formed from the first conductive layer ISL-CL1 (see, e.g., FIG. 6A).

Figure 7A:
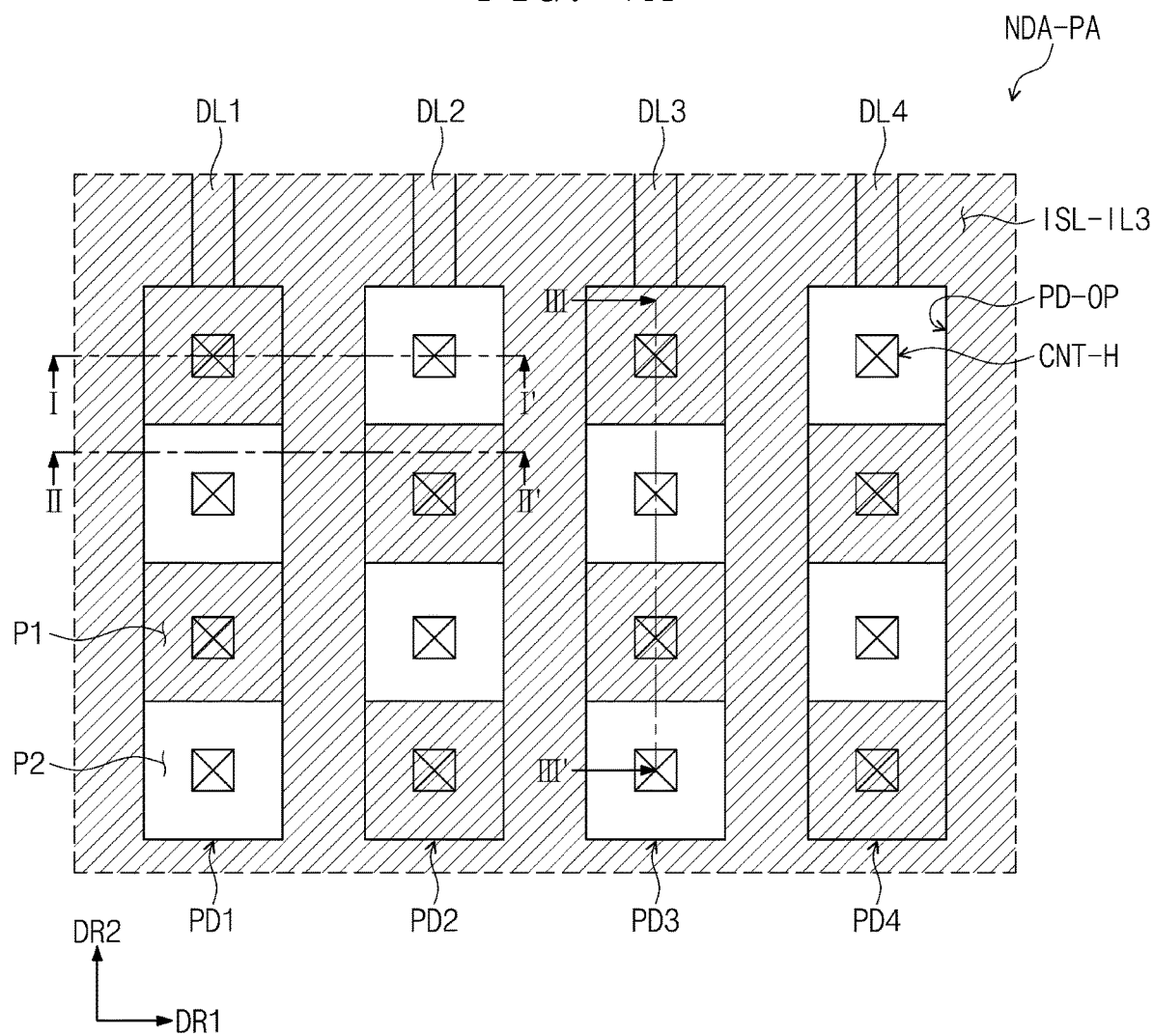
FIG. 7A is a plan view of a pad area of FIG. 4 according to an exemplary embodiment of the present inventive concept.
Figure 7B:
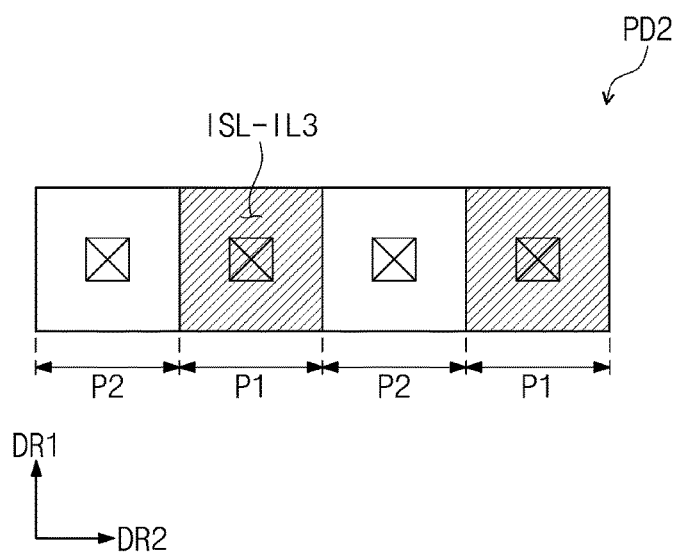
FIG. 7B is a plan view of a pad according to an exemplary embodiment of the present inventive concept.
Figure 8:
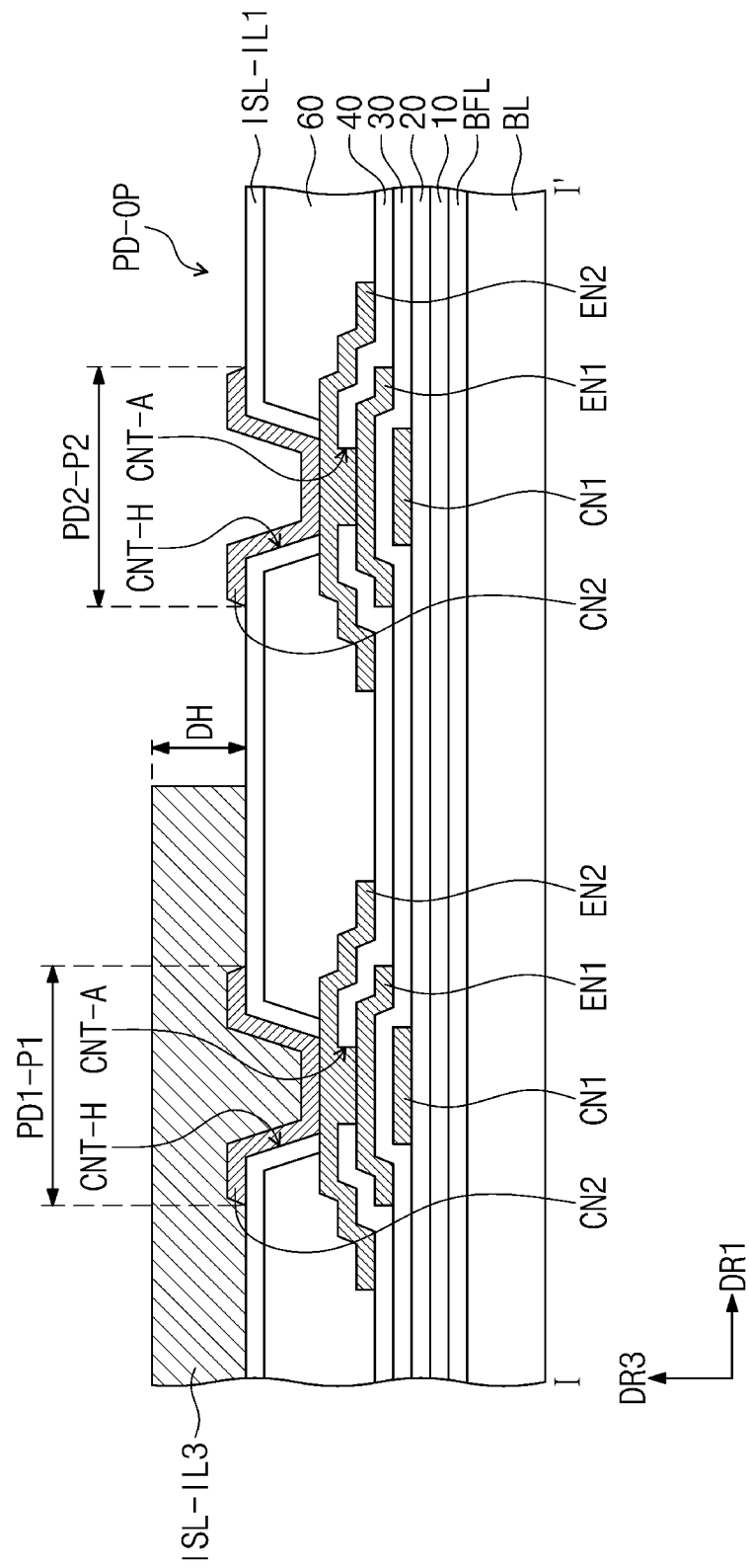
FIG. 8 is a cross-sectional view taken along line I-I' of FIG. 7A according to an exemplary embodiment of the present inventive concept.
Figure 9:
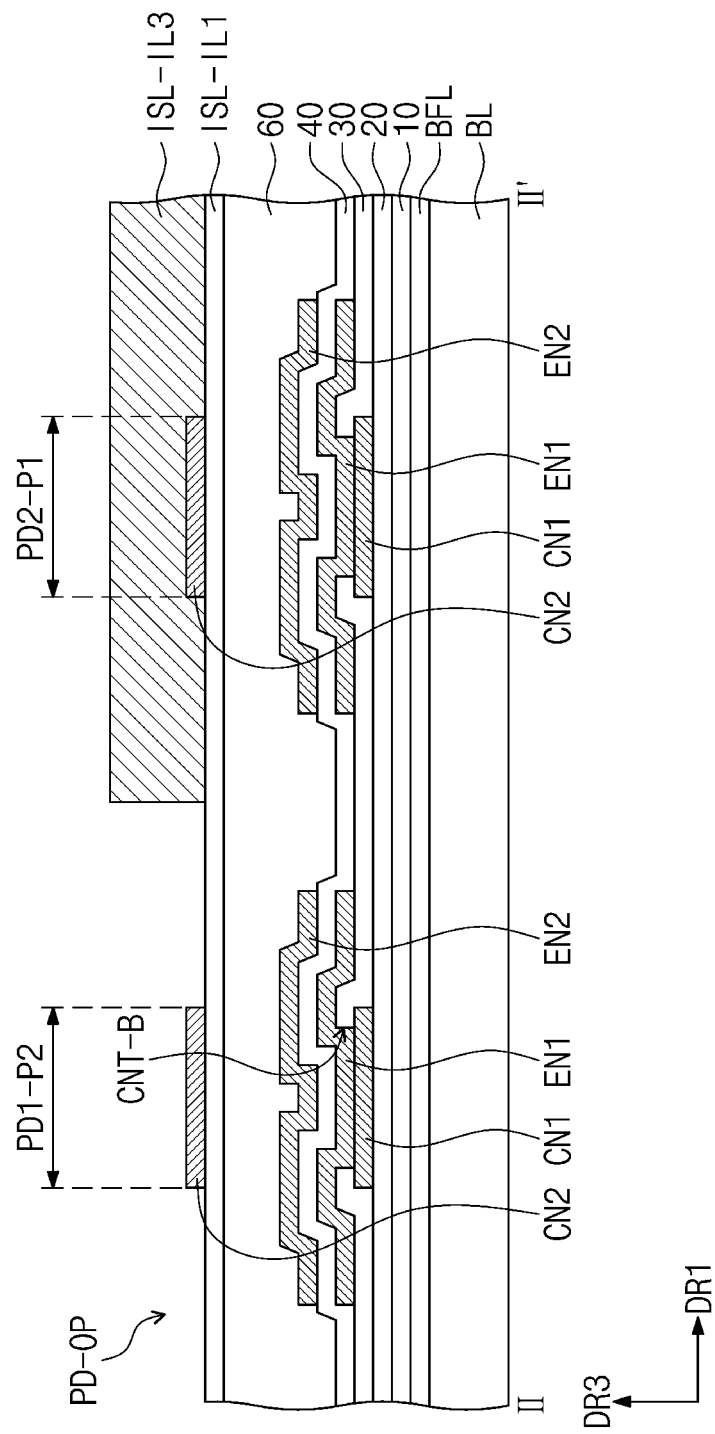
FIG. 9 is a cross-sectional view taken along line II-I' of FIG. 7A according to an exemplary embodiment of the present inventive concept.
Figure 10:
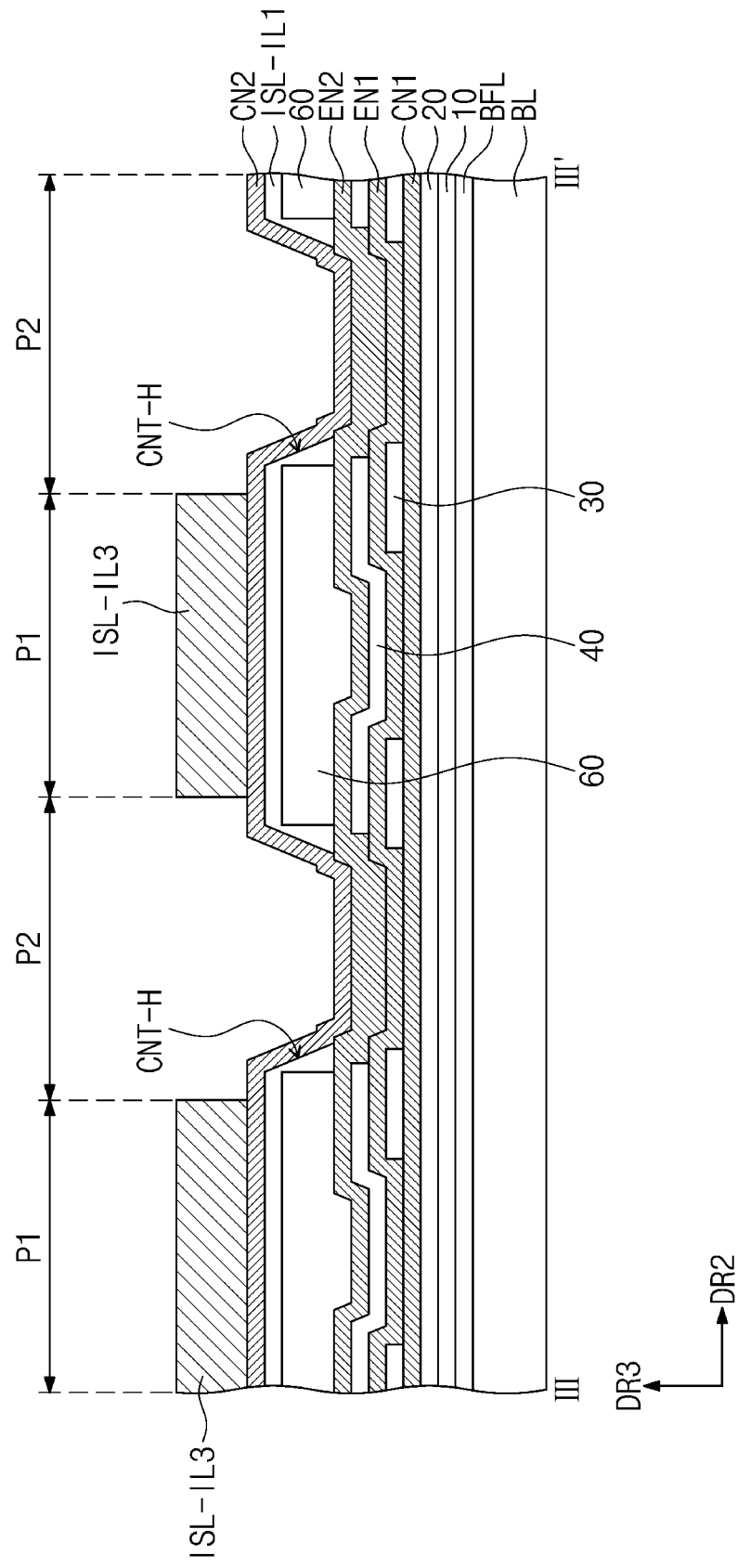
FIG. 10 is a cross-sectional view taken along line III-III' of FIG. 7A according to an exemplary embodiment of the present inventive concept.

FIG. 7A is a plan view of the pad area of FIG. 4 according to an exemplary embodiment of the present inventive concept. FIG. 7B is a plan view of a pad according to an exemplary embodiment of the present inventive concept. FIG. 8 is a cross-sectional view taken along line I-I' of FIG. 7A according to an exemplary embodiment of the present inventive concept. FIG. 9 is a cross-sectional view taken along line II-II' of FIG. 7A according to an exemplary embodiment of the present inventive concept. FIG. 10 is a cross-sectional view taken along line III-III' of FIG. 7A according to an exemplary embodiment of the present inventive concept.

FIG. 7A illustrates four first to fourth signal pads PD1 to PD4 of the signal pads DP-PD and ISL-PD disposed on the pad area NDA-PA illustrated in FIG. 4 and four first to fourth data lines DL1 to DL4 of the data lines DL illustrated in FIG. 4 as an example. The first to fourth signal pads PD1 to PD4 may be electrically connected to the first to fourth data lines DL1 to DL4, respectively. In addition, FIG. 7B illustrates a second signal pad PD2 of the first to fourth signal pads PD1 to PD4 illustrated in FIG. 7A as an example.

As briefly described above with reference to FIG. 4, at least a portion of each of the signal pads DP-PD and ISL-PD according to the present inventive concept may be covered by the second input insulation layer ISL-IL3. Hereinafter, a structure of the signal pads DP-PD and ISL-PD covered by the second input insulation layer ISL-IL3 will be described in more detail.

Referring to FIGS. 7A and 7B, the first to fourth signal pads PD1 to PD4 may extend in the second direction DR2 and be arranged to be spaced a predetermined interval from each other in the first direction DR1.

According to an exemplary embodiment of the present inventive concept, each of the first to fourth signal pads PD1 to PD4 includes a first pad portion P1, which overlaps the second input insulation layer ISL-IL3, and a second pad portion P2 that does not overlap the second input insulation layer ISL-IL3. For example, the second input insulation layer ISL-IL3 may overlap the first pad portion P1 as a whole. However, the present inventive concept is not limited thereto. For example, the second input insulation layer ISL-IL3 may overlap a portion of the first pad portion P1.

A pad opening PD-OP through which the second pad portion P2 of each of the first to fourth signal pads PD1 to PD4 is exposed to an external space may be formed in the second input insulation layer ISL-IL3. As illustrated in FIG. 7A, although the pad opening PD-OP overlaps the second pad portion P2, the present embodiment of the present inventive concept is not limited thereto. For example, the pad opening PD-OP may also overlap a portion between the two signal pads adjacent to each other in addition to the second pad portion P2.

The anisotropic conductive film ACF (see, e.g., FIG. 4) may be disposed on the pad opening PD-OP. The second pad portion P2 of each of the first to fourth signal pads PD1 to PD4 may be electrically connected to the corresponding connection pad of the connection pads PCB-P through the anisotropic conductive film ACF disposed on the pad opening PD-OP.

According to an exemplary embodiment of the present inventive concept, the first pad portion P1 and the second pad portion P2 of each of the first to fourth signal pads PD1 to PD4 may be alternately arranged in the second direction DR2, and the first pad portion P1 and the second pad portion P2 may be repeatedly disposed. For example, the arrangement structures of the first pad portion P1 and the second pad portion P2 of the two signal pads, which are adjacent to each other, of the first to fourth signal pads PD1 to PD4 may be different from each other.

For example, in the case of the first signal pad PD1, the first pad portion P1 that is closest to the first data line DL1 is connected to the first data line DL1, and the second pad portion P2 arranged in the second direction DR2 is connected to the first pad portion P1. For example, the first signal pad PD1 may have a structure in which the first pad portion P and the second pad portion P2 are alternately repeatedly disposed in the second direction DR2.

In the case of the second signal pad PD2 that is closest to the first signal pad PD1, the second pad portion P2 that is closest to the second data line DL2 is connected to the second data line DL2, and the first pad portion P1 arranged in the second direction DR2 is connected to the second pad portion P2. For example, the second signal pad PD2 may have a structure in which the second pad portion P2 and the first pad portion P are alternately repeatedly disposed in the second direction DR2.

In the case of the third signal pad PD3 that is closest to the second signal pad PD2, the third signal pad PD3 may have substantially the same structure as that of the first signal pad PD1. For example, the third signal pad PD3 may have a structure in which the first pad portion P1 and the second pad portion P2 are alternately repeatedly disposed in the second direction DR2.

In the case of the fourth signal pad PD4 that is closest to the third signal pad PD3, the fourth signal pad PD4 may have substantially the same structure as that of the second signal pad PD2. For example, the fourth signal pad PD4 may have a structure in which the second pad portion P2 and the first pad portion P are alternately repeatedly disposed in the second direction DR2.

For example, each of odd-numbered signal pads disposed on the pad area NDA-PA in the first direction DR1 may have the same structure as that of each of the first signal pad PD1 and the third signal pad PD3, and each of even-numbered signal pads disposed on the pad area NDA-PA in the first direction DR1 may have the same structure as that of each of the second signal pad PD2 and the fourth signal pad PD4.

In addition, the first pad portion P1 of the first signal pad PD1 and the second pad portion P2 of the second signal pad PD2, which are adjacent to each other in the first direction DR1, may overlap each other in the first direction DR1, and the second pad portion P2 of the first signal pad PD1 and the first pad portion P1 of the second signal pad PD2 may overlap each other in the first direction DR1.

Thus, even though an external conductive foreign substance may be disposed between the two adjacent first signal pads PD1 and PD2, the short circuit between the first and second signal pads PD1 and PD2 may be prevented.

For example, even though the external conductive foreign substance may contact the second pad portion P2 of the second signal pad PD2, the first pad portion P1 of each of the first signal pad PD1 and the third signal pad PD3, which overlap each other in the first direction DR1, may be covered by the second input insulation layer ISL-IL3. As a result, the short circuit between the second signal pad PD2 and the first signal pad PD1 or the third signal pad PD3 may be prevented.

In addition, it may be assumed that the external conductive foreign substance contacting the second pad portion P2 of the second signal pad PD2 overlaps the second pad portion P2 of each of the first signal pad PD1 and third signal pad PD3. In even this case, the contact of the external conductive foreign substance with the second pad portion P2 of each of the first signal pad PD1 and third signal pad PD3 may be prevented by a thickness of the second input insulation layer ISL-IL3. Since the external conductive foreign substance is disposed on the second input insulation layer ISL-IL3, the contact of the second pad portion P2 of each of the first signal pad PD1 and third signal pad PD3 having a thickness less than that of the second input insulation layer ISL-IL3 may be prevented. As a result, the short circuit between the second signal pad PD2 and the first signal pad PD1 or the third signal pad PD3 may be prevented.

According to an exemplary embodiment of the present inventive concept, a plurality of pad contact holes CNT-H for the electrical connection with the data line may be formed in each of the first to fourth signal pads PD1 to PD4. For example, the pad contact holes CNT-H may be arranged to be spaced a predetermined interval from each other in the second direction DR2.

According to an exemplary embodiment of the present inventive concept, each of the first pad portion P1 and the second pad portion P2 may overlap one corresponding contact hole of the pad contact holes CNT-H. For example, two adjacent contact holes of the pad contact holes CNT-H may overlap each of the first pad portion P1 and the second pad portion P2, respectively.

Hereinafter, a cross-sectional structure of the first to fourth signal pads PD1 to PD4 will be described in detail with reference to FIGS. 8 to 10. FIG. 8 illustrates a first pad portion DPI-P1 of the first signal pad PD1 and a second pad portion PD2-P2 of the second signal pad PD2 according to an exemplary embodiment of the present inventive concept, and FIG. 9 illustrates second pad portion PD1-P2 of the first signal pad PD1 and first pad portion PD2-P1 of the second signal pad PD2 according to an exemplary embodiment of the present inventive concept.

Referring to FIGS. 5A and 8, each of the first to fourth signal pads PD1 to PD4 includes a first pad electrode CN1, a first sub electrode EN1, a second sub electrode EN2, and a second pad electrode CN2.

The first pad electrode CN1 is disposed on the second insulation layer 20. The first pad electrode CN1 of the first signal pad PD1 and the first pad electrode CN1 of the second signal pad PD2 may be respectively connected to one end of the first data line DL1 and one end of the second data line DL2, which are illustrated in FIG. 7A. According to an exemplary embodiment of the present inventive concept, the first pad electrode CN1 may be formed at the same time when the upper electrode UE of FIG. 5A is formed. However, the present inventive concept is not limited thereto. For example, the first pad electrode CN1 may be formed at a different time from that of the upper electrode UE.

The third insulation layer 30 may cover the first pad electrode CN1 and be disposed on the second insulation layer 20. The first sub electrode EN1 may overlap the first pad electrode CN1 and be disposed on the third insulation layer 30. The second sub electrode EN2 may be disposed on the fourth insulation layer 40. For example, the second sub electrode EN2 may be connected to the first sub electrode EN1 through a first sub contact hole CNT-A formed in the fourth insulation layer 40.

The sixth insulation layer 60 may cover the second sub electrode EN2 and be disposed on the fourth insulation layer 40. According to an exemplary embodiment of the present inventive concept, the fifth insulation layer 50 may be omitted on the pad area NDA-PA. For example, the fifth insulation layer 50 may not overlap the pad area NDA-PA. The sub input insulation layer ISL-IL1 may be disposed on the first pad insulation layer 60. Hereinafter, in this specification, the sixth insulation layer 60 will be described as the first pad insulation layer, and the sub input insulation layer ISL-IL will be described as the second pad insulation layer.

The second pad electrode CN2 may be disposed on the second pad insulation layer ISL-IL1. The second pad electrode CN2 may be connected to the second sub electrode EN2 through the pad contact hole CNT-H passing through the first pad insulation layer 60 and the second pad insulation layer ISL-ILL.

According to an exemplary embodiment of the present inventive concept, the first pad insulation layer 60 may include a hole, and the second pad insulation layer ISL-IL1 may be disposed in the hole of the first pad insulation layer 60. For example, the second pad insulation layer ISL-IL1 may cover side surfaces of the hole of the first pad insulation layer 60, and the pad contact hole CNT-H may be formed in the second pad insulation layer ISL-IL1 and may correspond to the hole of the first pad insulation layer 60.

According to an exemplary embodiment of the present inventive concept, the first pad portion P1 and the second pad portion P2 of each of the first to fourth signal pads PD1 to DP4 may be provided by the second pad electrode CN2. For example, the first pad portion P1 and the second pad portion P2 may be disposed on the first pad insulation layer 60 or the second pad insulation layer ISL-IL1 to be partitioned by the second pad electrode CN2 exposed to the external space.

In addition, the second pad electrode CN2 according to an exemplary embodiment of the present inventive concept may be formed through the same process as the second conductive pattern, which is described with reference to FIG. 6C.

In this specification, although the first pad insulation layer 60 and the second pad insulation layer ISL-IL1 are disposed on the pad area NDA-PA of the display panel DP, the present embodiment of the present inventive concept is not limited thereto. For example, the second pad insulation layer ISL-IL1 may be omitted. In this case, the second pad electrode CN2 may be disposed on the first pad insulation layer 60 and be connected to the second sub electrode EN2 through the pad contact hole CNT-H formed in the first pad insulation layer 60.

According to an exemplary embodiment of the present inventive concept, the second input insulation layer ISL-IL3 may cover the second pad electrode CN2 of the first signal pad PD1 and be disposed on the second pad insulation layer ISL-IL1 For example, the second input insulation layer ISL-L3 may entirely cover the second pad electrode CN2 of the first signal pad PD). As an additional example, the second input insulation layer ISL-IL3 may have a thickness DH in the third direction DR3. As illustrated in FIG. 8, the second pad portion PD2-P2 of the second signal pad PD2, which does not overlap the second input insulation layer ISL-IL3, may be exposed to the external space. For example, the second pad portion PD2-P2 may be disposed on the pad opening PD-OP formed in the second input insulation layer ISL-IL3.

For example, a first length (e.g. height) from a top surface of the base layer BL to a top surface of the second input insulation layer ISL-IL3 may be greater than a second length from the top surface of the base layer BL to a top surface of the second pad portion PD2-P2 of the second signal pad PD2 (e.g., a top surface of the second pad electrode CN2 of the second pad portion PD2-P2).

Referring to FIG. 9, the first sub electrode EN1 may be electrically connected to the first pad electrode CN1 through a second sub contact hole CNT-B provided in the third insulation layer 30. Thus, an external driving signal received through the second pad electrode CN2 may be transmitted to the data line DL.

For example, the second pad electrode CN2 corresponding to the second pad portion P2 may receive the driving signal through the connection pad PCB-P of the circuit board PCB (see, e.g., FIG. 4). The driving signal transmitted to the second pad electrode CN2 may be transmitted to the first pad electrode CN1 via the connection between the second sub electrode EN2 and the first sub electrode EN1 through the first sub contact hole CNT-A (see, e.g., FIG. 8). Since the first pad electrode CN1 contacts one end of the data line DL, the driving signal may be transmitted from the first pad electrode CN1 to the data line DL.

Referring to FIG. 10, the first pad electrode CN1 may extend in the second direction DR2 and be disposed on the first pad portion P1 and the second pad portion P2. For example, the first pad electrode CN1 may completely cover the first pad portion P1 and the second pad portion P2 and may be continuous from the first pad portion P1 to the second pad portion P2. Similarly, the second pad electrode CN2 may overlap the first pad portion P1 and the second pad portion P2 and be disposed on the sub input insulation layer ISL-ILL. For example, the second pad electrode CN2 may entirely overlap the first pad portion P1 and the second pad portion P2.

In addition, the first pad portion P1 and the second pad portion P2 of each of the first to fourth signal pads PD1 to DP4 according to an exemplary embodiment of the present inventive concept may be alternately repeatedly disposed in the second direction DR2. Thus, each of the first to fourth signal pads PD1 to DP4 may be connected to a corresponding connection pad of the connection pads PCB-P of the circuit board PCB and at least two or more connection areas.

Figure 11:
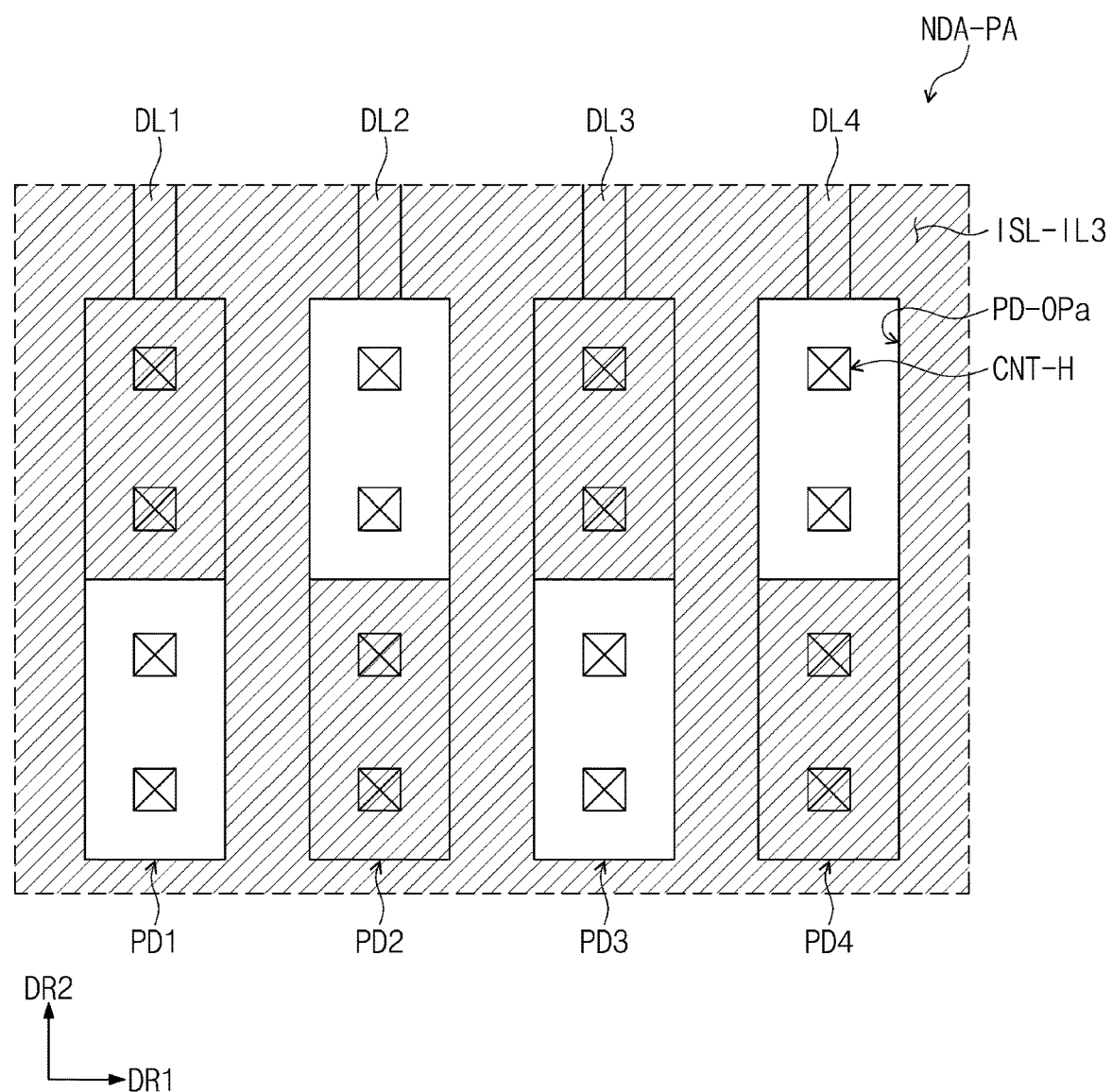
FIG. 11 is a plan view of a pad area of FIG. 4 according to an exemplary embodiment of the present inventive concept.
Figure 12:
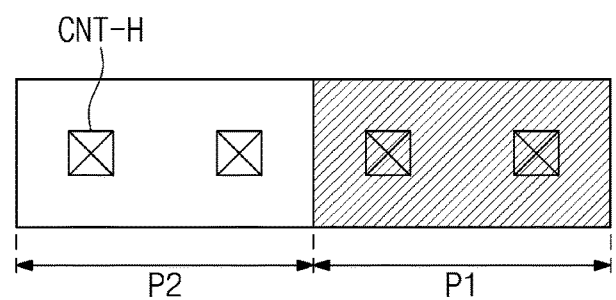
FIG. 12 is a cross-sectional view of a display panel according to an exemplary embodiment of the present inventive concept.

FIG. 11 is a plan view of the pad area of FIG. 4 according to an exemplary embodiment of the present inventive concept. FIG. 12 is a cross-sectional view of a display panel according to an exemplary embodiment of the present inventive concept.

A pad area NDA-PA of FIG. 11 may be substantially the same as the pad area NDA-PA of FIG. 7A except for the number of pad contact holes CNT-H overlapping a second input insulation layer ISL-IL3. Thus, for convenience of description, the modified structure will be mainly described.

Referring to FIGS. 11 and 12, the second input insulation layer ISL-IL3 overlaps a first pad portion P1 of each of first to fourth signal pads PD1 to PD4 and does not overlap a second pad portion P2. For example, the second pad portion P2 of each of the first to fourth signal pads PD1 to PD4 may be exposed to an external space by a pad opening PD-OPa formed in the second input insulation layer ISL-IL3.

According to an exemplary embodiment of the present inventive concept, each of the first pad portion P1 and the second pad portion P2 may overlap at least two pad contact holes CNT-H. The pad contact holes CNT-H may be the contact hole formed in the first pad insulation layer 60 described with reference to FIG. 8. In this specification, the two or more pad contact holes CNT-H overlapping the first pad portion P1 may be described as a first contact hole part, and the two or more contact holes CNT-H overlapping the second pad portion P2 may be described as a second contact hole part.

As described above, the second pad portion P2 of each of the first to fourth signal pads PD1 to PD4 according to an exemplary embodiment of the present inventive concept may be exposed to the external space through the pad opening PD-OPa formed in the second input insulation layer ISL-IL3. For example, on the plane, the pad opening PD-OPa of FIG. 11 has a surface area greater than that of the pad opening PD-OP of FIG. 7A.

Although the pad opening formed in the second input insulation layer ISL-IL3 is described with reference to FIGS. 7A and 11, a shape of the pad opening formed in the second input insulation layer ISL-IL3 may be variously modified.

According to an exemplary embodiment of the present inventive concept, the two signal pads adjacent to each other among the signal pads may be prevented from being short-circuited through the insulation layer covering a portion of each of the signal pads. The short circuit between the signal pads may be prevented to increase the overall driving reliability of the display device.

While the present inventive concept has been described with reference to exemplary embodiments thereof, it will be understood by those of ordinary skill in the art that various changes in form and details may be made thereto without departing from the spirit and scope of the present inventive concept.

What is claimed is:
1. A display device comprising:
 a base layer including a display area and a non-display area adjacent to the display area;
 a circuit element layer disposed on the base layer;
 a display element layer overlapping; the display area and disposed on the circuit element layer;
 a plurality of signal pads overlapping the non-display area and disposed on the base layer, wherein the plurality of signal pads are spaced a predetermined interval from each other in a first direction, and are electrically connected to the circuit element layer; and
 an input sensing layer comprising a conductive layer and an input insulation layer, wherein the conductive layer is disposed on the display element layer, and the input insulation layer covers the conductive layer and a portion of each of the signal pads,
 wherein each of the signal pads comprises a first pad portion and a second pad portion, wherein the first pad portion overlaps the input insulation layer, and the second pad portion does not overlap the input insulation layer,
 wherein the signal pads comprise a first signal ad and a second signal pad adjacent to the first signal pad in the first direction, and the first pad portion of the first signal pad overlaps the second pad portion of the second signal pad in the first direction.

2. The display device of claim 1, wherein the first pad portion and the second pad portion are alternately arranged in a second direction substantially perpendicular to the first direction.

3. The display device of claim 2, wherein the second pad portion of the first signal pad overlaps the first pad portion of the second signal pad in the first direction.

4. The display device of claim 2, wherein the first pad portion is of a plurality of first pad portions of each of the signal pads, and the second pad portion is of a plurality of second pad portions of each of the signal pads, wherein the plurality of first pad portions and the plurality of second pad portions are alternately arranged in the second direction.

5. The display device of claim 2, wherein the input insulation layer entirely overlaps the first pad portion.

6. The display device of claim 2, farther comprising a circuit board comprising a plurality of connection pads that are electrically connected to the signal pads, respectively, wherein the second pad portion of each of the signal pads is electrically connected to a corresponding connection pad of the connection pads.

7. The display device of claim 6, wherein the input insulation layer includes a pad opening exposing the second pad portion, and
the display device further comprises an anisotropic conductive film disposed between the signal pads and the connection pads, wherein the anisotropic conductive film electrically connects the second pad portion of each of the signal pads to the corresponding connection pad through the pad opening.

8. A display device comprising:
a base layer including a display area and a non display area adjacent to the display area;
a circuit element layer disposed on the base layer;
a display element layer overlapping the display area and disposed on the circuit element layer;
a plurality of signal pads overlapping the non-display area and disposed on the base layer, wherein the plurality of signal pads are spaced a predetermined interval from each other in a first direction, and are electrically connected to the circuit element layer; and
an input sensing layer comprising a conductive layer and an input insulation layer, wherein the conductive layer is disposed on the display element layer, and the input insulation layer covers the conductive layer and a portion of each of the signal pads,
wherein each of the signal pads comprises a first pad portion and a second pad portion, wherein the first pad portion overlaps the input insulation layer, and the second pad portion does not overlap the input insulation layer, wherein each of the signal pads comprises:
a first pad electrode electrically connected to the display element layer and disposed on the base layer;
a first pad insulation layer covering the first pad electrode and disposed on the base layer, wherein a plurality of contact holes are formed in the first pad insulation layer; and
a second pad electrode disposed on the first pad insulation layer and electrically connected to the first pad electrode through the plurality of contact holes,
wherein the second pad electrode of each of the signal pads forms the first pad portion and the second pad portion.

9. The display device of claim 8, wherein a portion of the second pad electrode corresponding to the first pad portion is entirely covered by the input insulation layer.

10. The display device of claim 8, wherein the contact holes are spaced apart from each other and arranged in a second direction substantially perpendicular to the first direction.

11. The display device of claim 10, wherein a first contact hole of the plurality of contact holes and a second contact hole, adjacent to the first contact hole, of the plurality of contact holes overlap the first pad portion and the second pad portion, respectively.

12. The display device of claim 10, wherein first and second contact holes of the plurality of contact holes form a first contact hole part, and third and fourth contact holes of the plurality of contact holes form a second contact hole part, and
the first contact hole part overlaps the first pad portion, and the second contact hole part overlaps the second pad portion.

13. The display device of claim 8, wherein the conductive layer comprises a first conductive pattern and a second conductive pattern, and
the input insulation layer comprises:
a first input insulation layer covering the first conductive pattern disposed on the display element layer; and
a second input insulation layer covering, the second conductive pattern disposed on the first input insulation layer,
wherein the second input insulation layer covers the first pad portion.

14. The display device of claim 13, wherein the input insulation layer further comprises a sub input insulation layer disposed between the display element layer and the first input insulation layer.

15. The display device of claim 14, wherein each of the signal pa s further comprises a second pad insulation layer disposed on the first pad insulation layer, and
the plurality of contact holes pass through the first pad insulation layer and the second pad insulation layer.

16. The display device of claim 15, wherein the second pad it insulation layer and the sub input insulation layer are connected to each other and disposed on the same layer.

17. The display device of claim 15, wherein each of the first pad insulation layer and the second input insulation layer comprises an organic material, and
the second pad insulation layer comprises an inorganic material.

18. The display device of claim 13, wherein the second conductive pattern and the second pad electrode are respectively disposed on the first input insulation layer and the first pad insulation layer through the same process.

19. The display device of claim 8, wherein the circuit element layer comprises a signal line electrically connected to the display element layer, and
one end of the signal line contacts the first pad electrode.

20. The display device of claim 1, wherein a first length from a top surface of the base layer to a top surface of the input insulation layer is greater than a second length from the top surface of the base layer to a top surface of the second pad portion of each of the signal pads.

* * * * *